United States Patent
Im

(10) Patent No.: US 12,159,662 B2
(45) Date of Patent: Dec. 3, 2024

(54) SEMICONDUCTOR DEVICE INCLUDING WRITE TRANSISTOR AND READ TRANSISTOR DISPOSED ON A PLANE SUBSTANTIALLY PARALLEL TO SUBSTRATE

(71) Applicant: SK hynix Inc., Icheon-si (KR)

(72) Inventor: Mir Im, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 174 days.

(21) Appl. No.: 17/749,131

(22) Filed: May 19, 2022

(65) Prior Publication Data

US 2023/0197142 A1    Jun. 22, 2023

(30) Foreign Application Priority Data

Dec. 21, 2021  (KR) .................. 10-2021-0184318

(51) Int. Cl.
| | |
|---|---|
| *H10B 12/00* | (2023.01) |
| *G11C 8/14* | (2006.01) |
| *G11C 11/408* | (2006.01) |
| *G11C 11/4097* | (2006.01) |
| *H01L 27/088* | (2006.01) |

(52) U.S. Cl.
CPC ............ *G11C 11/4097* (2013.01); *G11C 8/14* (2013.01); *G11C 11/4085* (2013.01); *H01L 27/088* (2013.01); *H10B 12/00* (2023.02)

(58) Field of Classification Search
CPC ............ G11C 11/4097; G11C 11/4085; G11C 11/4096; H10B 12/00; H01L 27/088
See application file for complete search history.

(56) References Cited

U.S. PATENT DOCUMENTS

| | | | |
|---|---|---|---|
| 11,335,684 B2 * | 5/2022 | Karda | ............... H01L 29/78672 |
| 2008/0285325 A1 | 11/2008 | Kameshiro et al. | |
| 2023/0008471 A1 * | 1/2023 | Harada | ............... G11C 11/4096 |
| 2023/0084611 A1 * | 3/2023 | Sato | .................. H01L 29/78391 |
| | | | 257/295 |
| 2023/0371234 A1 * | 11/2023 | Ling | .................... H10B 12/053 |

FOREIGN PATENT DOCUMENTS

KR           101881447 B1       10/2013

* cited by examiner

*Primary Examiner* — Mushfique Siddique

(57) ABSTRACT

A semiconductor device according to an embodiment of the present disclosure includes a write transistor and a read transistor disposed over a substrate. The write transistor includes a write word line disposed on a plane that is substantially parallel to a surface of the substrate over the substrate, a write gate dielectric layer disposed over the write word line, a write channel layer disposed over the write gate dielectric layer, and a write bit line disposed over the substrate and extending in a direction substantially perpendicular to a surface of the substrate, and electrically connected to one end of the write channel layer. The read transistor includes a read channel layer disposed on the plane over the substrate, a read gate dielectric layer disposed over the read channel layer, and a read gate electrode layer disposed over the read gate dielectric layer and electrically connected to the other end of the write channel layer.

15 Claims, 38 Drawing Sheets

SEMICONDUCTOR DEVICE INCLUDING WRITE TRANSISTOR AND READ TRANSISTOR DISPOSED ON A PLANE SUBSTANTIALLY PARALLEL TO SUBSTRATE

CROSS-REFERENCE TO RELATED APPLICATIONS

The present application claims priority under 35 U.S.C. § 119(a) to Korean Application No. 10-2021-0184318, filed on Dec. 21, 2021 in the Korean Intellectual Property Office, which is incorporated herein by reference in its entirety.

BACKGROUND

1. Technical Field

The present disclosure generally relates to a semiconductor device and a method of fabricating the same, and more particularly, to a semiconductor device including a write transistor and a read transistor, and a method of fabricating the same.

2. Related Art

As a feature size of a semiconductor memory device decreases, the available space occupied by a memory cell in the semiconductor memory device also decreases. Various studies are being conducted to maintain the degree of integration of memory cells in the reduced space.

In a conventional case, a memory cell employs a one transistor and one capacitor (1T-1C) structure in which one transistor and one capacitor are electrically connected. Recently, in order to address the requests for memory devices requiring high integration and high capacity, research has been conducted to reduce the size of a memory cell by reducing the size of a capacitor occupying a relatively large space in the memory cell or by omitting the capacitor. Through these studies, memory cells implementing higher cell density, by arranging the write transistors and the read transistors over a substrate densely, may emerge.

SUMMARY

A semiconductor device according to an embodiment of the present disclosure may include a write transistor and a read transistor disposed over a substrate. The write transistor may include a write word line disposed on a plane that is substantially parallel to a surface of the substrate over the substrate, a write gate dielectric layer disposed over the write word line, a write channel layer disposed over the write gate dielectric layer, and a write bit line disposed over the substrate and extending in a direction substantially perpendicular to a surface of the substrate, and electrically connected to one end of the write channel layer. The read transistor may include a read channel layer disposed on the plane over the substrate, a read gate dielectric layer disposed over the read channel layer, and a read gate electrode layer disposed over the read gate dielectric layer and electrically connected to the other end of the write channel layer.

In a method of fabricating a semiconductor device according to another embodiment of the present disclosure, a write word line disposed on a plane that is substantially parallel to a surface of the substrate may be formed over the substrate. The write word line may extend in a first direction substantially parallel to the surface of the substrate. A read word line and a read bit line disposed to be substantially parallel to the write word line may be formed on the plane. A read channel layer may be formed between the read word line and the read bit line on the plane. A write gate dielectric layer and a read gate dielectric layer may be formed over the write word line and the read channel layer, respectively. A write channel layer may be formed over the write gate dielectric layer. A read gate electrode layer may be formed over the read gate dielectric layer. A write bit line extending in a second direction substantially perpendicular to the surface of the substrate over the substrate may be formed. The write bit line is disposed to contact the write channel layer.

A semiconductor device according to another embodiment of the present disclosure may include a write transistor and a read transistor disposed over a substrate. The write transistor may include a write bit line extending in a first direction substantially perpendicular to a surface of the substrate, over the substrate, a write channel layer having one end in contact with the write bit line, a write gate dielectric layer disposed over the write channel layer, and a write word line disposed over the write gate dielectric layer and extending in a second direction substantially parallel to the surface of the substrate. The read transistor may include a read gate electrode layer disposed to contact the other end of the write channel layer, a read gate dielectric layer disposed over the read gate electrode layer, and a read channel layer disposed over the read gate dielectric layer.

BRIEF DESCRIPTION OF THE DRAWINGS

FIGS. 5A to 18A are plan views schematically illustrating a method of fabricating a semiconductor device according to an embodiment of the present disclosure.

FIGS. 5B to 18B are cross-sectional views taken along line A-A' of the semiconductor device of FIGS. 5A to 18A.

DETAILED DESCRIPTION

Figure 1:
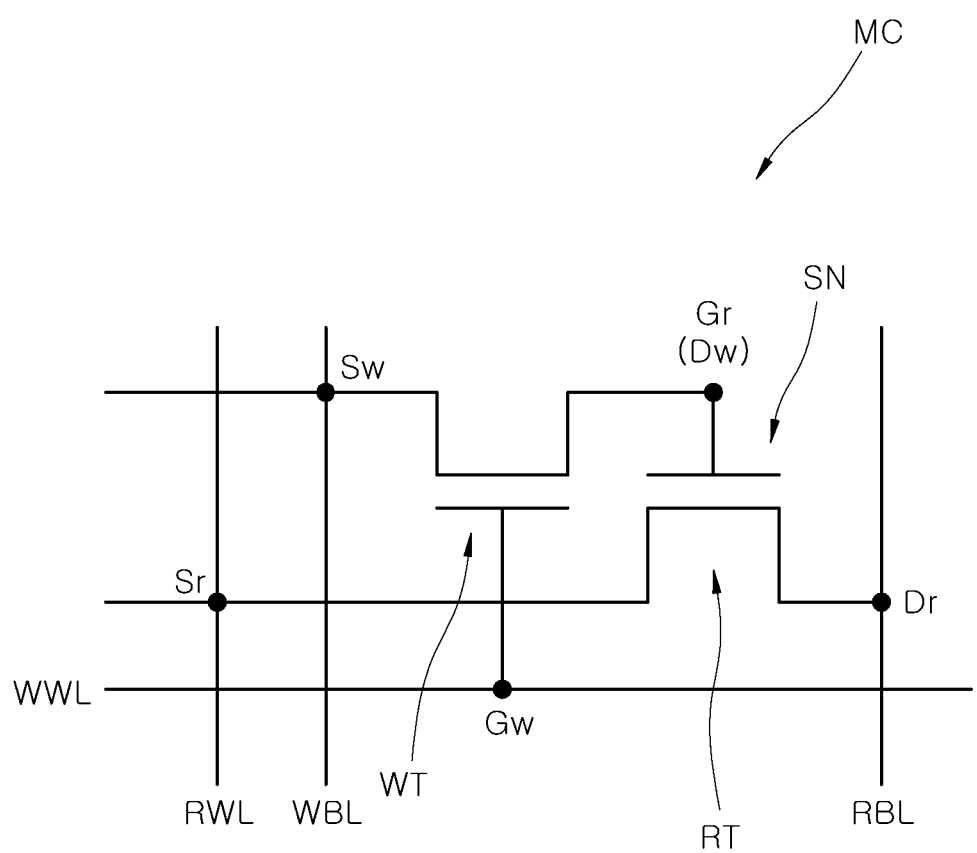
FIG. 1 is a circuit diagram of a semiconductor device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

If an element is referred to be located on another element, it may be understood that the element is directly located on the other element, or an additional element may be interposed between the element and the other element. The same reference numerals refer to the same elements throughout the specification. In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

FIG. 1 is a circuit diagram of a semiconductor device according to an embodiment of the present disclosure. Referring to FIG. 1, a semiconductor device 1 may include a memory cell MC. The memory cell MC may be a capacitor-less memory cell compared to a conventional DRAM cell. The memory cell MC may include a write transistor WT and a read transistor RT that are electrically connected to each other.

The write transistor WT may include a write gate electrode Gw connected to a write word line WWL and a write source electrode Sw connected to a write bit line WBL. The read transistor RT may include a read gate electrode Gr, a read source electrode Sr connected to a read word line RWL, and a read drain electrode Dr connected to a read bit line RBL. A write drain electrode Dw of the write transistor WT may be electrically connected to the read gate electrode Gr of the read transistor RT.

In the memory cell MC of FIG. 1, a read gate dielectric layer SN of the read transistor RT may function as a storage dielectric layer for storing signal information. In addition, the read gate electrode Gr of the read transistor RT may function as a storage electrode layer.

In an embodiment, a write operation of the memory cell MC may be performed as follows. The write transistor WT may be turned-on or turned-off according to a voltage signal applied to the write word line WWL. When the write transistor WT is turned-on, an electrical signal of the write bit line WBL may be applied to the read gate electrode Gr of the read transistor RT as a voltage level through the write drain electrode Dw of the write transistor WT. As an example, when a predetermined positive voltage signal is applied to the write bit line WBL while the write transistor WT is turned-on, electric charges may be charged in the read gate dielectric layer SN, and a voltage level of the read gate electrode Gr may increase. Then, after the write transistor WT is turned-off, the read gate electrode Gr may maintain the increased voltage level as a voltage of a first level. Accordingly, the memory cell MC may store the voltage state of the first level and a charge state of the electric charges as first signal information. As will be described later, when the read gate electrode Gr maintains the voltage of the first level, the read transistor RT may maintain the turned-on state.

As another example, when a voltage of 0 V is applied to the write bit line WBL while the write transistor WT is turned-on, the electric charges stored in the read gate dielectric layer SN may be discharged to the write bit line WBL, and a voltage level of the read gate electrode Gr may decrease. Then, after the write transistor WT is turned-off, the read gate electrode Gr may maintain the reduced voltage level as a voltage of a second level. Accordingly, the memory cell MC may store the voltage state of the second level and the discharge state of the electric charges as second signal information. As will be described later, when the read gate electrode Gr maintains the voltage of the second level, the read transistor RT may maintain the turned-off state.

In an embodiment, a read operation of the memory cell MC may be performed as follows. In a standby state, the read word line RWL and the read bit line RBL may maintain the same voltage level at zero (0 V). When the read operation is performed, the voltage level of the read word line RWL may be increased to a predetermined positive voltage while the voltage level of the read bit line RBL is maintained at 0 V.

When the read gate electrode Gr maintains the voltage of the first level (i.e., when the memory cell MC stores the first signal information), the read transistor RT may maintain a turned-on state. The read transistor RT maintains the turned-on state so that the voltage level of the read bit line RBL may be increased from 0 V. Alternatively, when the read gate electrode Gr maintains the voltage of the second level (i.e., when the memory cell MC stores the second signal information), the read transistor RT may remain a turned-off state, and the read bit line RBL may maintain the voltage level of 0 V.

The memory cell MC may amplify the voltage level of the read bit line RBL, which changes depending on whether the read transistor RT is turned-on or turned-off, using a sense amplifier, and then may compare the amplified voltage level with a reference voltage level, thereby distinguishing the signal information stored in the memory cell MC.

Figure 2:
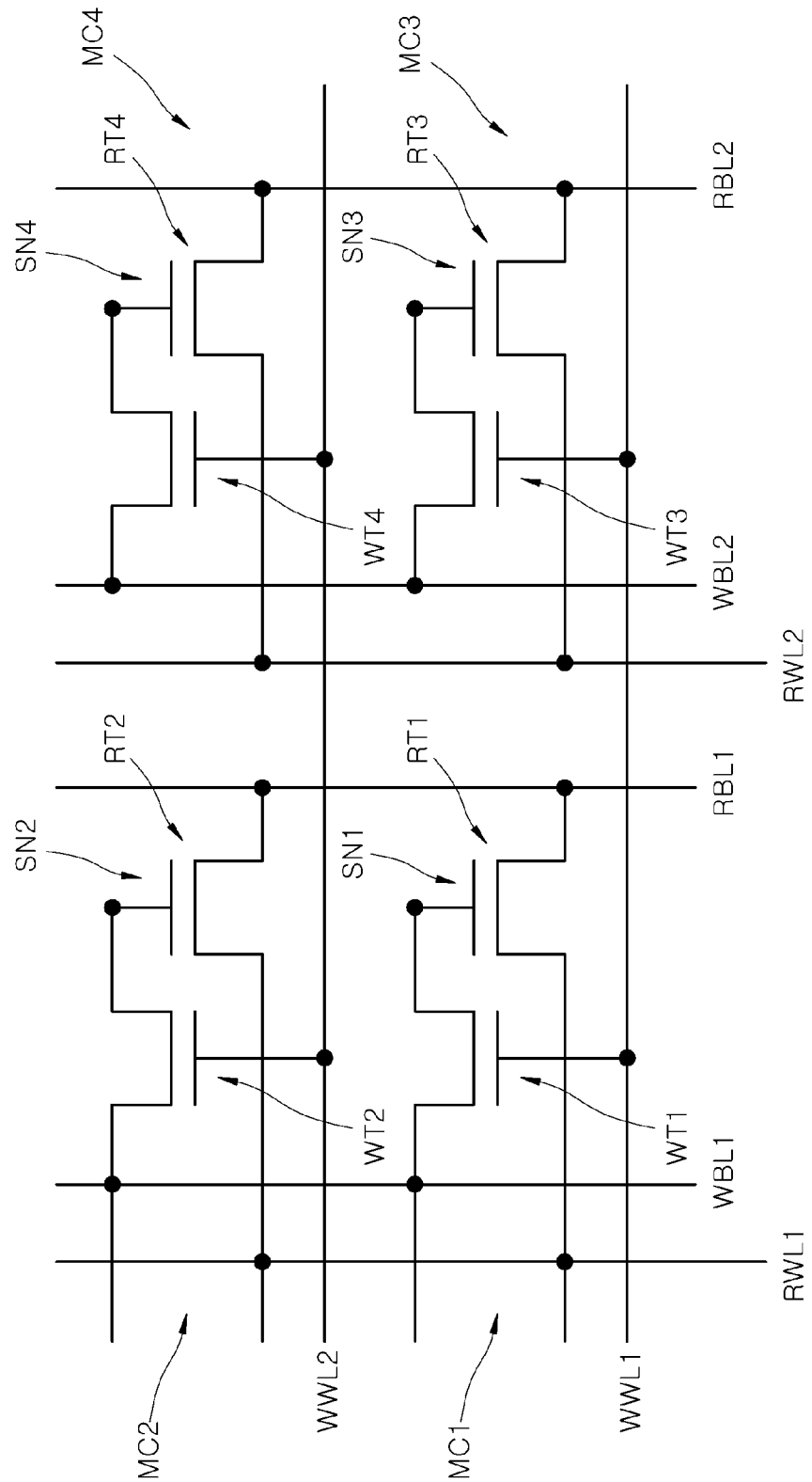
FIG. 2 is a circuit diagram schematically illustrating a plurality of memory cells of a semiconductor device according to an embodiment of the present disclosure.

FIG. 2 is a circuit diagram schematically illustrating a plurality of memory cells of a semiconductor device according to an embodiment of the present disclosure. Referring to FIG. 2, a semiconductor device 2 may include first to fourth memory cells MC1, MC2, MC3, and MC4. The first memory cell MC1 may include a first write transistor WT1 and a first read transistor RT1. Likewise, the second, third, and fourth memory cells MC2, MC3, and MC4 may include corresponding second, third, and fourth write transistors WT2, WT3, and WT4 and second, third, and fourth read transistors RT2, RT3, and RT4, respectively. A configuration of each of the first to fourth write transistors WT1, WT2, WT3, and WT4 may be substantially the same as a configuration of the write transistor WT of the memory cell MC described with reference to FIG. 1. In addition, a configuration of each of the first to fourth read transistors RT1, RT2, RT3, and RT4 may be substantially the same as a configuration of the read transistor RT of the memory cell MC described with reference to FIG. 1.

Referring to FIG. 2, the first memory cell MC1 and the second memory cell MC2 may share a first write bit line WBL1, a first read word line RWL1, and a first read bit line RBL1. The first memory cell MC1 and the third memory cell MC3 may share a first write word line WWL1. The third memory cell MC3 and the fourth memory cell MC4 may share a second write bit line WBL2, a second read word line RWL2, and a second read bit line RBL2. The second memory cell MC2 and the fourth memory cell MC4 may share a second write word line WWL2.

Although four memory cells MC1, MC2, MC3, and MC4 constituted with two write bit lines WBL1 and WBL2, two read word lines RWL1 and RWL2, and two read bit lines RBL1 and RBL2 are illustrated in FIG. 2, the present disclosure is not necessarily limited the illustrated configuration. For example, nine or more memory cells each constituted by three or more write bit lines, read word lines, and read bit lines may be disposed.

Figure 3A:
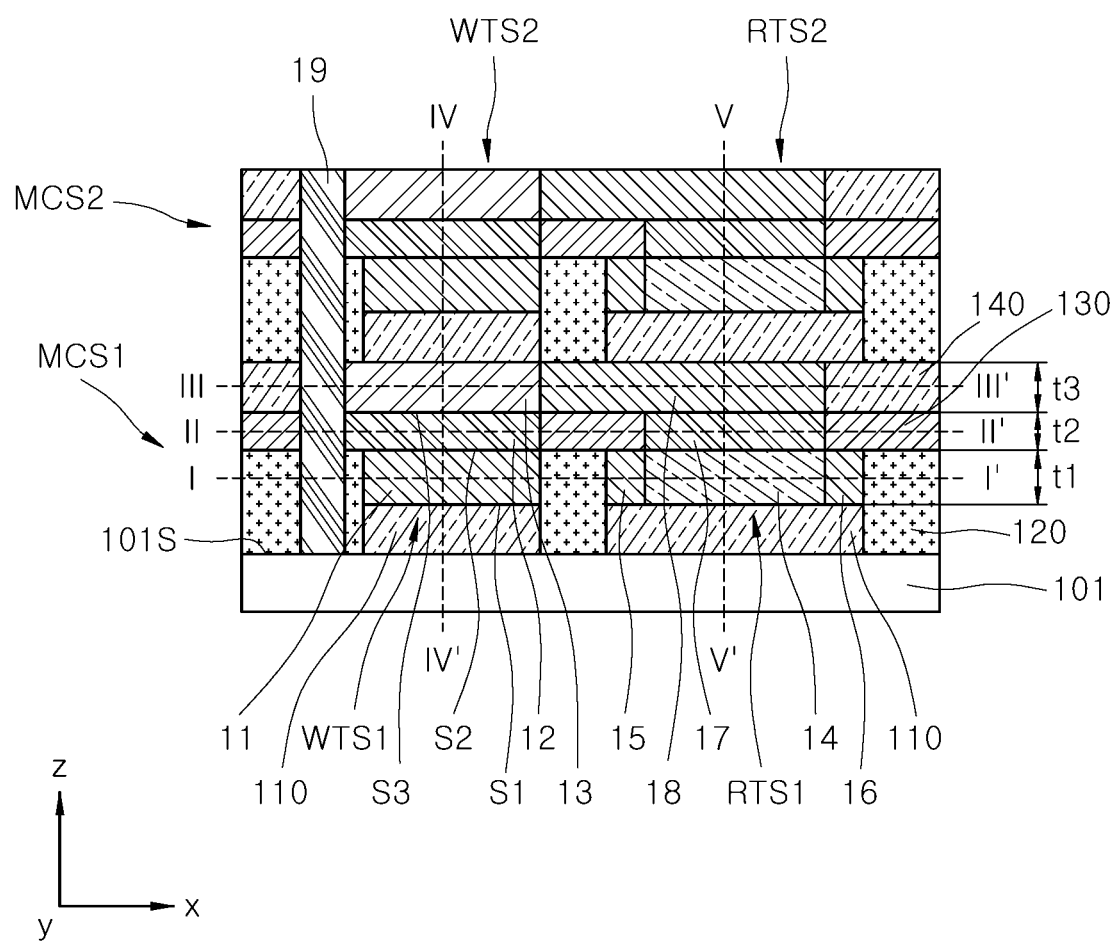
FIGS. 3A to 3F are cross-sectional views schematically illustrating a semiconductor device according to an embodiment of the present disclosure.
Figure 3B:
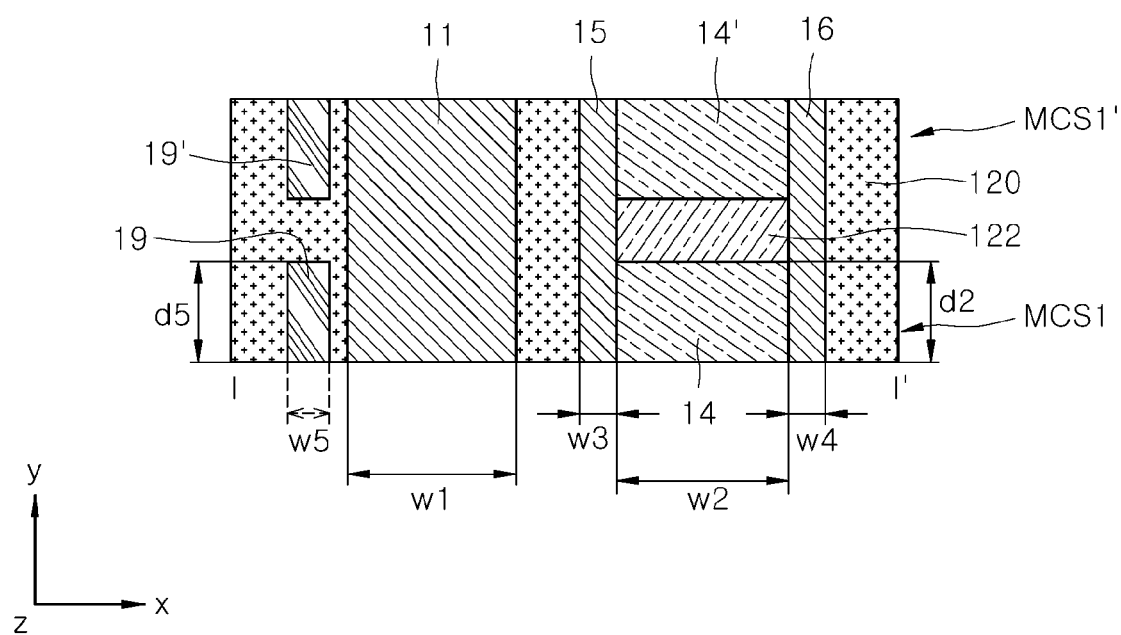
Figure 3C:
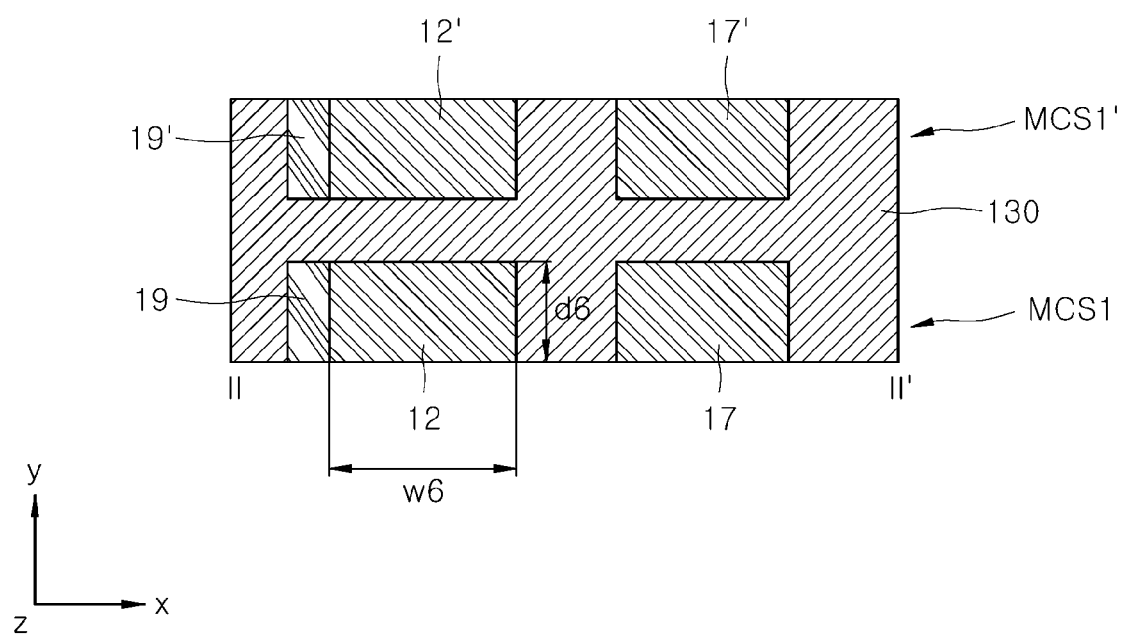
Figure 3D:
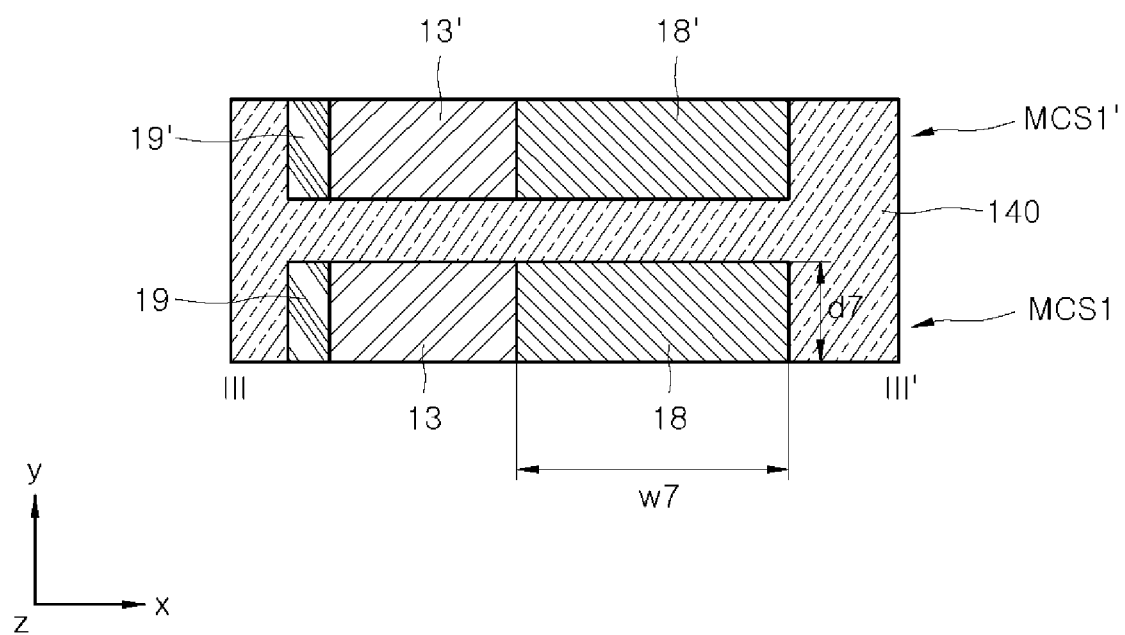
Figure 3E:
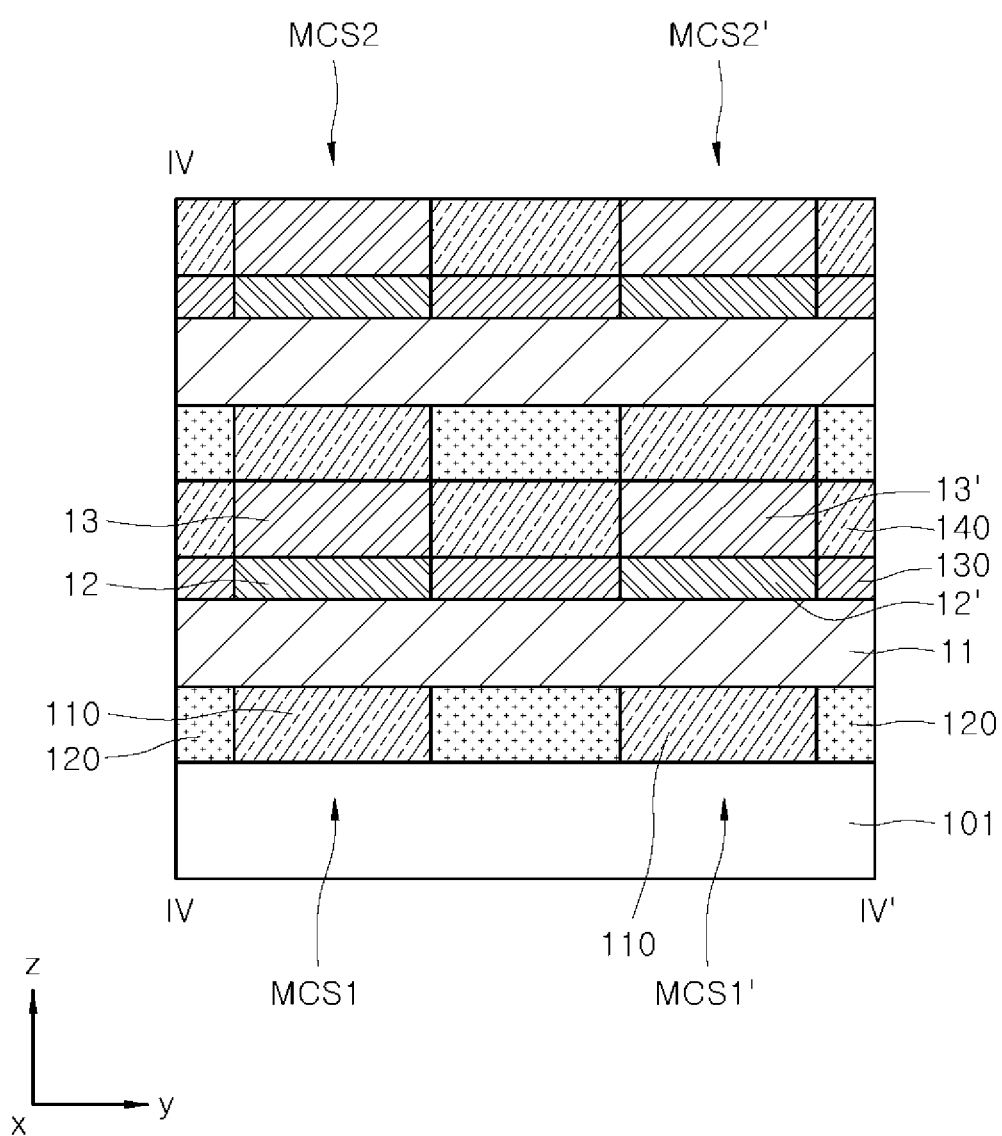
Figure 3F:
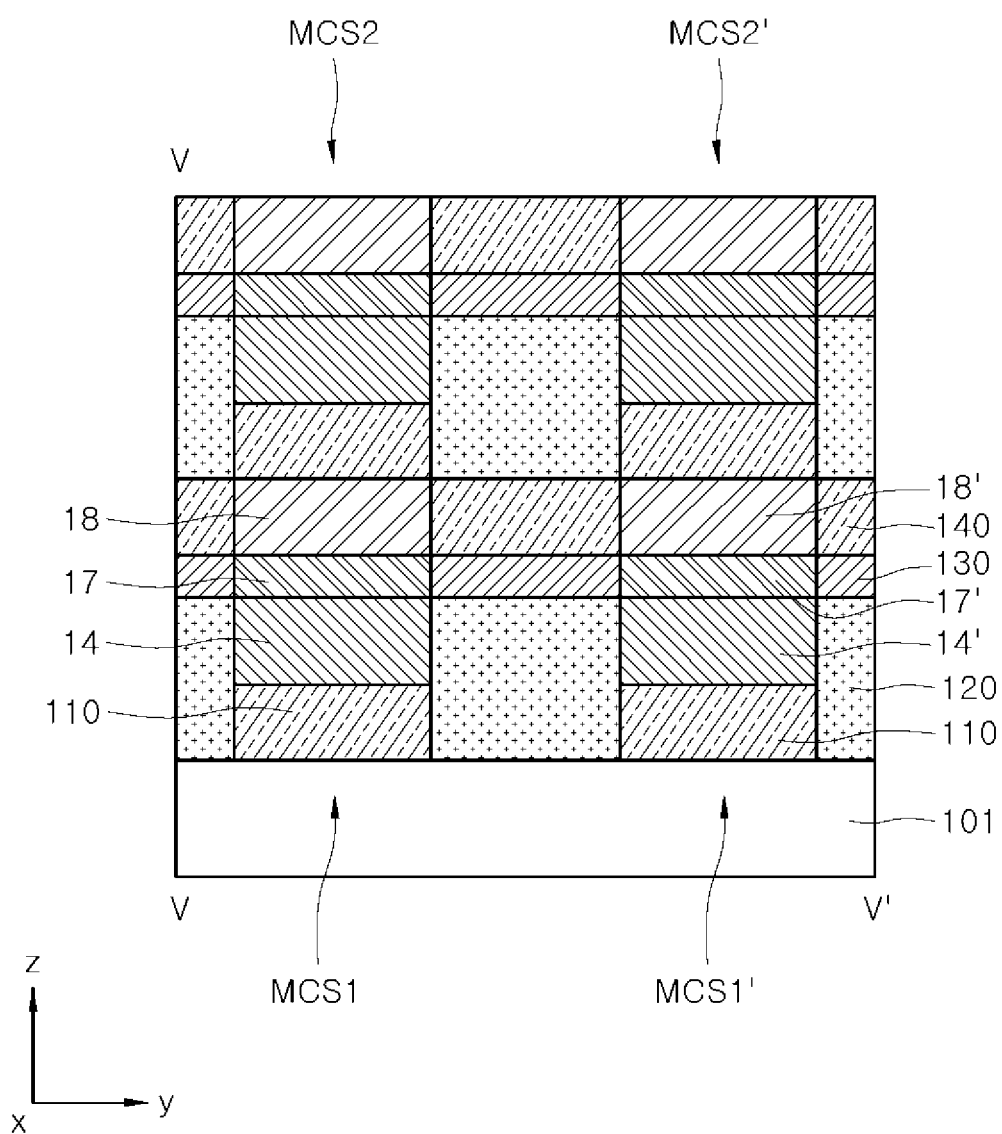

FIG. 3A is a cross-sectional view schematically illustrating a semiconductor device 3 according to an embodiment of the present disclosure. FIG. 3B is a cross-sectional view taken along line I-I' of the semiconductor device 3 of FIG. 3A and shown on the x-y plane. FIG. 3C is a cross-sectional view taken along line II-II' of the semiconductor device 3 of FIG. 3A and shown on the x-y plane. FIG. 3D is a cross-sectional view taken along line III-III' of the semiconductor device 3 of FIG. 3A and shown on the x-y plane. FIG. 3E is a cross-sectional view taken along line IV-IV' of the semiconductor device 3 of FIG. 3A and shown on the y-z plane. FIG. 3F is a cross-sectional view taken along line V-V' of the semiconductor device 3 of FIG. 3A and shown on the y-z plane.

Referring to FIGS. 3A to 3F, the semiconductor device 3 may include a substrate 101, and first and second memory cells MCS1 and MCS2 disposed over the substrate 101. In an embodiment, circuit configurations of the first and second memory cells MCS1 and MCS2 may correspond to those of the first and second memory cells MC1 and MC2 of FIG. 2. The first memory cell MCS1 may include a first write transistor WTS1 and a first read transistor RTS1. The second memory cell MCS2 may include a second write transistor WTS2 and a second read transistor RTS2. The second memory cell MCS2 may be disposed to overlap with the first memory cell MCS1 in the z-direction.

Although not shown in FIG. 3A, a first adjacent cell MCS1' may be disposed adjacent to the first memory cell MCS1 in the y-direction. A configuration of the first adjacent cell MCS1' is partially illustrated in FIGS. 3B to 3F. In addition, a second adjacent cell MCS2' may be disposed adjacent to the second memory cell MCS2 in the y-direction. A configuration of the second adjacent cell MCS2' is partially illustrated in FIGS. 3E and 3F. The second adjacent cell MCS2' may be disposed to overlap with the first adjacent cell MCS1' in the z-direction.

Referring to FIGS. 3A to 3F, the first memory cell MCS1 may be disposed over the substrate 101, and the second memory cell MCS2 may be disposed over the first memory cell MCS1.

The first write transistor WTS1 of the first memory cell MCS1 may include a write word line 11 disposed on a surface S1 positioned over the substrate 101, a write gate dielectric layer 12 disposed over the write word line 11, a write channel layer 13 disposed over the write gate dielectric layer 12, and a write bit line 19 electrically connected to an end of the write channel layer 13. The write word line 11 may extend in a direction (i.e., the y-direction) substantially parallel to a surface 101S of the substrate 101. The write bit line 19 may extend in a direction (i.e., the z-direction) substantially perpendicular to the surface 101S of the substrate 101. The write bit line 19 may be shared by the first and second memory cells MCS1 and MCS2.

The first read transistor RTS1 of the first memory cell MCS1 may include a read channel layer 14 disposed on the surface S1 over the substrate 101, a read word line 15 and a read bit line 16 disposed at opposite ends of the read channel layer 14 on the surface S1, a read gate dielectric layer 17 disposed over the read channel layer 14, and a read gate electrode layer 18 disposed over the read gate dielectric layer 17 and electrically connected to the other end of the write channel layer 13 in the x-direction.

A configuration of the second memory cell MCS2 may be substantially the same as the configuration of the first memory cell MCS1. The second write transistor WTS2 of the second memory cell MCS2 may be disposed to overlap with the first write transistor WTS1 in the vertical direction (z-direction) over the first write transistor WTS1. Likewise, the second read transistor RTS2 of the second memory cell MCS2 may be disposed to overlap with the first read transistor RTS1 in the z-direction over the first read transistor RTS1.

Referring to FIGS. 3A to 3F, the semiconductor device 3 may include a plurality of insulating layers 110, 120, 130, and 140. The plurality of insulating layers 110, 120, 130, and 140 may be disposed in spaces between electric components of the semiconductor device 3 over the substrate 101 to electrically insulate the electric components from each other. The electric components may include above-described elements of the first and the second memory cell MCS1 and MCS2.

Referring to FIGS. 3A, 3E, and 3F, the substrate 101 may include a semiconductor material. Specifically, the semiconductor material may include silicon (Si), germanium (Ge), gallium arsenide (GaAs), molybdenum sulfide (MoS2), molybdenum selenide (MoSe2), hafnium selenide (HfSe2), indium selenide (InSe), gallium selenide (GaSe), black phosphorus, indium-gallium-zinc oxide (IGZO), or a combination of two or more thereof. The substrate 101 may be doped with an n-type or p-type dopant to have conductivity. The substrate 101 may be electrically connected to the write bit line 19.

Although not shown in FIGS. 3A to 3F, the substrate 101 may include integrated circuits. The integrated circuits may be circuits for driving and controlling the memory cells. The integrated circuits may include, for example, devices such as diodes and transistors. In addition, at least one conductive layer may be disposed between the substrate 101 and a base insulating layer 110. The conductive layer may function as a wiring that connects the integrated circuits to each other or that connects the integrated circuits to the memory cells.

The base insulating layer 110 may be disposed over the substrate 101. The base insulating layer 110 may include, for example, oxide, nitride, oxynitride, or a combination of two or more thereof.

Referring to FIGS. 3A, 3B, and 3E, the write word line 11 may be disposed on the surface S1 of the base insulating layer 110. The write word line 11 may be a line-shaped conductive pattern layer. The write word line 11 may extend in the y-direction substantially parallel to the surface 101S of the substrate 101. As shown in FIG. 3B, the write word line 11 may have a predetermined line width w1 on the surface S1 in the x-direction, which is perpendicular to the y-direction.

The write word line 11 may include a conductive material. The conductive material may include, for example, doped semiconductor, metal, conductive metal nitride, conductive metal carbide, conductive metal silicide, or conductive metal oxide. The conductive material may include, for example, n-type doped silicon (Si), platinum (Pt), gold (Au), palladium (Pd), molybdenum (Mo), nickel (Ni), tungsten (W), titanium (Ti), copper (Cu), aluminum (Al), ruthenium (Ru), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Referring to FIGS. 3A, 3B, and 3F, the read channel layer 14 may be disposed on the surface S1 of the base insulating layer 110. The read channel layer 14 may be disposed to be spaced apart from the write word line 11 in the x-direction. The read channel layer 14 may have a cross-section on a plane substantially parallel to the surface 101S of the substrate 101 as shown in FIG. 3B. As an example, the read channel layer 14 may have a rectangular cross-section having a predetermined width w2 in the x-direction and a predetermined length d2 in the y-direction.

Referring to FIGS. 3B and 3F again, a read channel layer 14' of the first adjacent cell MCS1' may be disposed to be spaced apart from the read channel layer 14 of the first memory cell MCS1 in the y-direction. The read channel layer 14' of the first adjacent cell MCS1' may have substantially the same configuration as the read channel layer 14 of the first memory cell MCS1. The read channel layer 14' of the first adjacent cell MCS1' may be separated from the read channel layer 14 of the first memory cell MCS1 in the y-direction by an insulating layer 122.

The read channel layer 14 may have electrically semiconducting properties. The read channel layer 14 may include, for example, semiconductor, conductive metal oxide, transition metal chalcogenide, or a combination of two or more thereof. As an example, the semiconductor may include doped silicon (Si). As another example, the conductive metal oxide may include indium oxide ($In_2O_3$), dopant-doped indium oxide ($In_2O_3$), indium gallium zinc oxide ($InGaZnO_4$), zinc oxide (ZnO), indium gallium oxide ($InGaO_3$), or the like. The dopant may include titanium (Ti), tungsten (W), silicon (Si), or a combination of two or more thereof.

The read word line 15 and the read bit line 16 may be disposed at opposite ends of the read channel layer 14, in the x-direction, on the surface S1 of the base insulating layer 110. Each of the read word line 15 and the read bit line 16 may be a line-shaped conductive pattern layer. The read word line 15 and the read bit line 16 may be electrically connected to the read channel layer 14.

The read word line 15 and the read bit line 16 may extend in the y-direction substantially parallel to the surface 101S of the substrate 101. The read word line 15 and the read bit line 16 may be disposed to be substantially parallel to the write word line 11. As shown in FIG. 3B, the read word line 15 and the read bit line 16 may have predetermined widths w3 and w4, respectively, along the x-direction on a cross section substantially parallel to the surface 101S of the substrate 101.

Each of the read word line 15 and the read bit line 16 may include a conductive material. The conductive material may include, for example, a doped semiconductor, metal, conductive metal nitride, conductive metal carbide, conductive metal silicide, or conductive metal oxide. The conductive material may include, for example, n-type doped silicon (Si), platinum (Pt), gold (Au), palladium (Pd), molybdenum (Mo), nickel (Ni), tungsten (W), titanium (Ti), copper (Cu), aluminum (Al), ruthenium (Ru), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

The write bit line 19 may be disposed to be spaced apart from the write word line 11. The write bit line 19 may extend in a direction (i.e., the z-direction) substantially perpendicular to the surface 101S of the substrate 101. The write bit line 19 may be disposed to contact at least a portion of the substrate 101.

The write bit line 19 may include a pillar structure. Referring to FIGS. 3A to 3D, the write bit line 19 may include a pillar structure having a shape of a square or rectangular pole. The write bit line 19 may have a predetermined width w5 in the x-direction and a predetermined length d5 along the y-direction on a cross section substantially parallel to the surface 101S of the substrate 101. In some embodiments, the pillar structure may have a shape of a polygonal pole, a cylindrical pole, or an elliptical pole instead of the square pole. The write bit line 19 may include a conductive material. The write bit line 19 may be made of substantially the same material as the write word line 11.

Referring to FIG. 3A again, the write word line 11, the read channel layer 14, the read word line 15, and the read bit line 16 may be disposed on the same plane S1 and have the same thickness t1. As a result, upper surfaces of the write word line 11, the read channel layer 14, the read word line 15, and the read bit line 16 may be positioned at the same level.

Referring to FIGS. 3B, 3C, and 3E, a write bit line 19' of the first adjacent cell MCS1' may be disposed to be spaced apart from the write bit line 19 of the first memory cell MCS1 in the y-direction. The write bit line 19' of the first adjacent cell MCS1' may have substantially the same configuration as the write bit line 19 of the first memory cell MCS1.

Referring to FIGS. 3A, 3C, and 3E, the write gate dielectric layer 12 may be disposed on a surface S2 of the write word line 11. The write gate dielectric layer 12 may be disposed to be partially overlapped with the underlying write word line 11 in the z-direction.

Referring to FIG. 3C, the write gate dielectric layer 12 may have a predetermined cross-section on a cross-section substantially parallel to the surface 101S of the substrate 101. As an example, the write gate dielectric layer 12 may have a rectangular cross-sectional shape having a predetermined width w6 in the x-direction and a predetermined length d6 in the y-direction on the cross-section. The width w6 of the write gate dielectric layer 12 may be greater than the width w1 of the write word line 11.

The write gate dielectric layer 12 may include, for example, silicon oxide, silicon nitride, silicon oxynitride, aluminum oxide, hafnium oxide, zirconium oxide, or a combination of two or more thereof. The write gate dielectric layer 12 may be disposed to contact the write bit line 19 in the x-direction.

Referring to FIGS. 3A, 3C, and 3F, the read gate dielectric layer 17 may be disposed to be spaced apart from the write gate dielectric layer 12 in the x-direction. The read gate dielectric layer 17 may be disposed on the same plane S2 as the write gate dielectric layer 12.

The read gate dielectric layer 17 may be disposed to be overlapped with the underlying read channel layer 14 in the z-direction. A cross-sectional area of the read gate dielectric layer 17 may be the same as the cross-sectional area of the read channel layer 14 on a cross-section substantially parallel to the surface 101S of the substrate 101. Accordingly, similar to the read channel layer 14, the read gate dielectric layer 17 may have a rectangular cross section having a predetermined width w2 in the x-direction and a predetermined length d2 in the y-direction on a cross section substantially parallel to the surface 101S of the substrate 101. The read gate dielectric layer 17 may be made of substantially the same material as the write gate dielectric layer 12.

Referring to FIGS. 3C and 3E again, a write gate dielectric layer 12' of the first adjacent cell MCS1' may be disposed to be spaced apart from the write gate dielectric layer 12 of the first memory cell MCS1 in the y-direction. The write gate dielectric layer 12' of the first adjacent cell MCS1' may have substantially the same configuration as the write gate dielectric layer 12 of the first memory cell MCS1. The write gate dielectric layer 12' of the first adjacent cell MCS1' may be separated from the write gate dielectric layer 12 of the first memory cell MCS1 by the insulating layer 130. In addition, a read gate dielectric layer 17' of the first adjacent cell MCS1' may be disposed to be spaced apart from the read gate dielectric layer 17 of the first memory cell MCS1 in the y-direction. The read gate dielectric layer 17' of the first adjacent cell MCS1' may have substantially the same configuration as the read gate dielectric layer 17 of the first memory cell MCS1. As shown in FIG. 3C, the read gate dielectric layer 17' of the first adjacent cell MCS1' may be separated from the read gate dielectric layer 17 of the first memory cell MCS1 by the insulating layer 130.

Referring to FIG. 3A again, the write gate dielectric layer 12 and the read gate dielectric layer 17 may have the same thickness t2 on the same surface S2. Accordingly, upper surfaces of the write gate dielectric layer 12 and the read gate dielectric layer 17 may be positioned at the same level.

Referring to FIGS. 3A, 3D, and 3E, the write channel layer 13 may be disposed on the surface S3 of the write gate dielectric layer 12. The write channel layer 13 may be disposed to be overlapped with the underlying write gate dielectric layer 12 in the z-direction. On a cross-section substantially parallel to the surface 101S of the substrate 101, the write channel layer 13 may have the same cross-sectional area as the write gate dielectric layer 12. Accordingly, the write channel layer 13 may have a rectangular cross-section having a predetermined width w6 in the x-direction and a predetermined length d6 in the y-direction, similar to the write gate dielectric layer 12. One end of the write channel layer 13 in the x-direction may be disposed to be in contact with the write bit line 19. The write channel layer 13 may be made of substantially the same material as the read channel layer 14.

Referring to FIGS. 3A, 3D, and 3F, the read gate electrode layer 18 may be disposed at the other end of the write channel layer 13 in the x-direction. The read gate electrode layer 18 may be disposed to cover the underlying read gate dielectric layer 17 in the z-direction. On a cross section substantially parallel to the surface 101S of the substrate 101, the read gate electrode layer 18 may have a rectangular cross-section having a predetermined width w7 in the x-direction and a predetermined length d7 in the y-direction. In this case, the width w7 of the read gate electrode layer 18 may be greater than the width (i.e., the width w2 of the read channel layer 14) of the underlying read gate dielectric layer 17, and the length d7 of the read gate electrode layer 18 may be equal to the length (i.e., the length d2 of the read channel layer 14) of the underlying read gate dielectric layer 17. Meanwhile, as shown in FIG. 3D, the length d7 of the read gate electrode layer 18 may be substantially equal to the length (i.e., the length d6 of the write gate dielectric layer 12) of the write channel layer 13 and the length d5 of the write bit line 19. The read gate electrode layer 18 may be made of substantially the same material as the write word line 11.

Referring to FIG. 3A, the write channel layer 13 and the read gate electrode layer 18 may be disposed on the same plane S3 and have substantially the same thickness t3. Accordingly, upper surfaces of the write channel layer 13 and the read gate electrode layer 18 may be positioned at the same level.

Referring to FIGS. 3D and 3E again, a write channel layer 13' of the first adjacent cell MCS1' may be disposed to be spaced apart from the write channel layer 13 of the first memory cell MCS1 in the y-direction. The write channel layer 13' of the first adjacent cell MCS1' may have substantially the same configuration as the write channel layer 13 of the first memory cell MCS1. As shown in FIG. 3D, the write channel layer 13' of the first adjacent cell MCS1' may be separated from the write channel layer 13 of the first memory cell MCS1 by the insulating layer 140.

In addition, a read gate electrode layer 18' of the first adjacent cell MCS1' may be disposed to be spaced apart from the read gate electrode layer 18 of the first memory cell MCS1 in the y-direction. The read gate electrode layer 18' of the first adjacent cell MCS1' may have substantially the same configuration as the read gate electrode layer 18 of the first memory cell MCS1. The read gate electrode layer 18' of the first adjacent cell MCS1' may be separated from the read gate electrode layer 18 of the first memory cell MCS1 by the insulating layer 140.

Referring to FIGS. 3A to 3F, the second memory cell MCS2 may be disposed over the first memory cell MCS1. A configuration of the second memory cell MCS2 may be substantially the same as a configuration of the first memory cell MCS1.

The write transistor WTS2 of the second memory cell MCS2 may be disposed to be overlapped with the write transistor WTS1 of the first memory cell MCS1 in the z-direction. The read transistor RTS2 of the second memory cell MCS2 may be disposed to be overlapped with the read transistor RTS1 of the first memory cell MCS1 in the z-direction. The write bit line 19 of FIG. 3A may be shared by the first and second memory cells MCS1 and MCS2.

Although not shown in FIGS. 3A to 3F, the read word line 15 of the first memory cell MCS1 may be electrically connected to a read word line of the second memory cell MCS2 in order to correspond to the circuit diagram of FIG. 2, and the read bit line 16 of the first memory cell MCS1 may be electrically connected to a read bit line of the second memory cell MCS2.

Referring to FIGS. 3A to 3F again, the first adjacent cell MCS1' may be disposed to be spaced apart from the first memory cell MCS1 in the y-direction when viewed on the same x-y plane. The configuration of the first adjacent cell MCS1' may be substantially the same as the configuration of the first memory cell MCS1. As shown in FIG. 3B, the first memory cell MCS1 and the first adjacent cell MCS1' may share the write word line 11. In addition, the second adjacent cell MCS2' may be disposed to be spaced apart from the second memory cell MCS2 in the y-direction on the same x-y plane. A configuration of the second adjacent cell MCS2' may be substantially the same as the configuration of the second memory cell MCS2. As shown in FIGS. 3E and 3F, the second adjacent cell MCS2' may be disposed to be overlapped with the first adjacent cell MCS1' in the z-direction. The second memory cell MCS2 and the second adjacent cell MCS2' may share a write word line.

Figure 4:
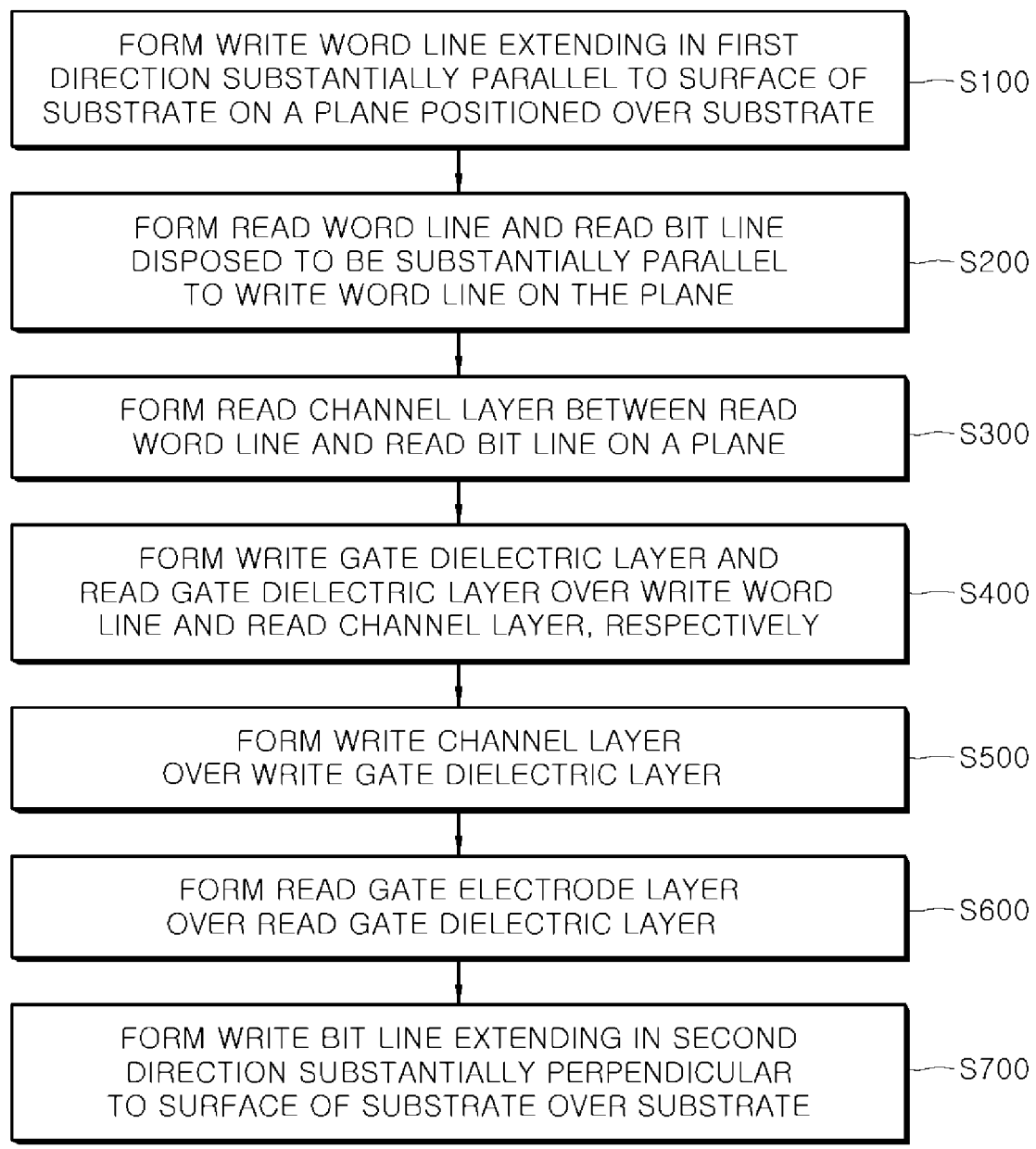
FIG. 4 is a flowchart schematically illustrating a method of fabricating a semiconductor device according to an embodiment of the present disclosure.

FIG. 4 is a flowchart schematically illustrating a method of fabricating a semiconductor device according to an embodiment of the present disclosure. Referring to S100 of FIG. 4, a write word line extending in a first direction substantially parallel to a surface of a substrate may be formed on a plane positioned over the substrate. Referring to S200 of FIG. 4, a read word line and a read bit line may be formed to be substantially parallel to the write word line on the plane. Referring to S300 of FIG. 4, a read channel layer may be formed between the read word line and the read bit line on the plane. In an embodiment, the read channel layer may be formed to have the same height as the write word line on the plane.

Referring to S400 of FIG. 4, a write gate dielectric layer and a read gate dielectric layer may be formed over the write word line and the read channel layer, respectively. In an embodiment, a process of forming the write gate dielectric layer and the read gate dielectric layer may include forming a dielectric layer over the write word line and the read channel layer and then patterning the dielectric layer.

Referring to S500 of FIG. 4, a write channel layer may be formed over the write gate dielectric layer. Referring to S600 of FIG. 4, a read gate electrode layer may be formed over the read gate dielectric layer. In this case, the read gate electrode layer may be formed to be connected to the write channel layer.

Referring to S700 of FIG. 4, a write bit line extending in a second direction substantially perpendicular to the surface of the substrate over the substrate may be formed. The write bit line may be disposed to contact the write channel layer. In an embodiment, a process of forming the write bit line may include forming a conductive pillar structure. In an embodiment, the process of forming the write bit line may include forming a hole extending in the second direction substantially perpendicular to the surface of the substrate over the substrate. The hole may expose at least a side surface of the write channel layer, and the hole may be filled with a conductive material.

In an embodiment, the write word line, the read word line, and the read bit line may include the same conductive material. In an embodiment, the read gate electrode layer and the write channel layer may be formed on substantially the same plane. A height of the read gate electrode layer over the read gate dielectric layer may be substantially the same as a height of the write channel layer over the write gate dielectric layer.

By proceeding with the above-described process steps, the semiconductor device according to an embodiment of the present disclosure may be fabricated.

FIGS. 5A to 18A are plan views schematically illustrating a method of fabricating a semiconductor device according to an embodiment of the present disclosure. FIGS. 5B to 18B are cross-sectional views taken along line A-A' of the semiconductor device of FIGS. 5A to 18A.

Figure 5A:
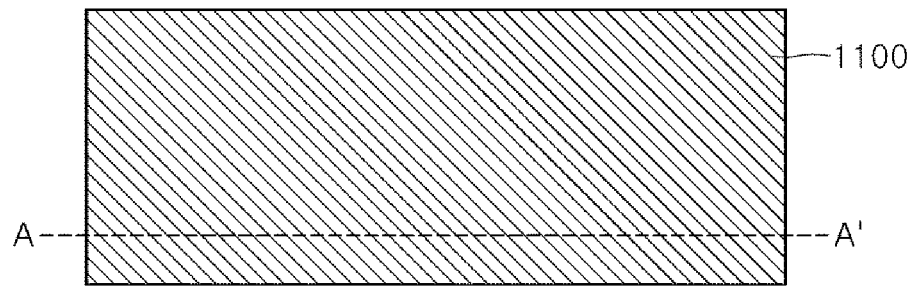
Figure 5A:
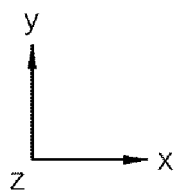
Figure 5B:
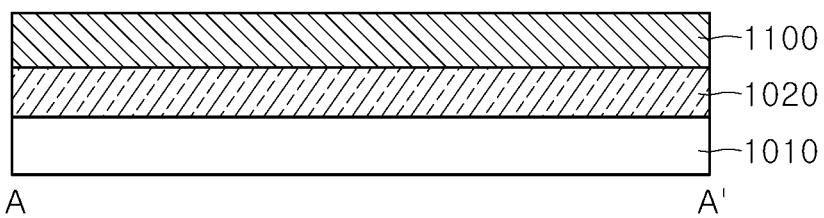

Referring to FIGS. 5A and 5B, a substrate 1010 may be provided. The substrate 1010 may include a semiconductor material. Specifically, the semiconductor material may include silicon (Si), germanium (Ge), gallium arsenide (GaAs), molybdenum sulfide ($MoS_2$), molybdenum selenide ($MoSe_2$), hafnium selenide ($HfSe_2$), indium selenide (InSe), gallium selenide (GaSe), black phosphorus, indium-gallium-zinc oxide (IGZO), or a combination of two or more thereof.

Then, a base insulating layer 1020 may be formed over the substrate 1010. The base insulating layer 1020 may include, for example, oxide, nitride, oxynitride, or a combination of two or more thereof. The base insulating layer 1020 may be formed, for example, using a chemical vapor deposition method, an atomic layer deposition method, a coating method, or the like.

Although not shown in FIGS. 5A and 5B, the substrate 1010 may include integrated circuits. The integrated circuits may be circuits for driving and controlling memory cells. The integrated circuits may include, for example, devices such as diodes and transistors. In addition, at least one layer of conductive layer may be disposed between the substrate 1010 and the base insulating layer 1020. The conductive layer may function as a wiring that connects the integrated circuits to each other or that connects the integrated circuits to the memory cells.

Subsequently, a first conductive layer 1100 may be formed over the base insulating layer 1020. The first conductive layer 1100 may include a conductive material. The conductive material may include, for example, doped semiconductor, metal, conductive metal nitride, conductive metal carbide, conductive metal silicide, or conductive metal oxide. The conductive material may include, for example, n-type doped silicon (Si), platinum (Pt), gold (Au), palladium (Pd), molybdenum (Mo), nickel (Ni), tungsten (W), titanium (Ti), copper (Cu), aluminum (Al), ruthenium (Ru), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. The first conductive layer 1100 may be formed, for example, using a chemical vapor deposition method, an atomic layer deposition method, or a sputtering method.

Figure 6A:
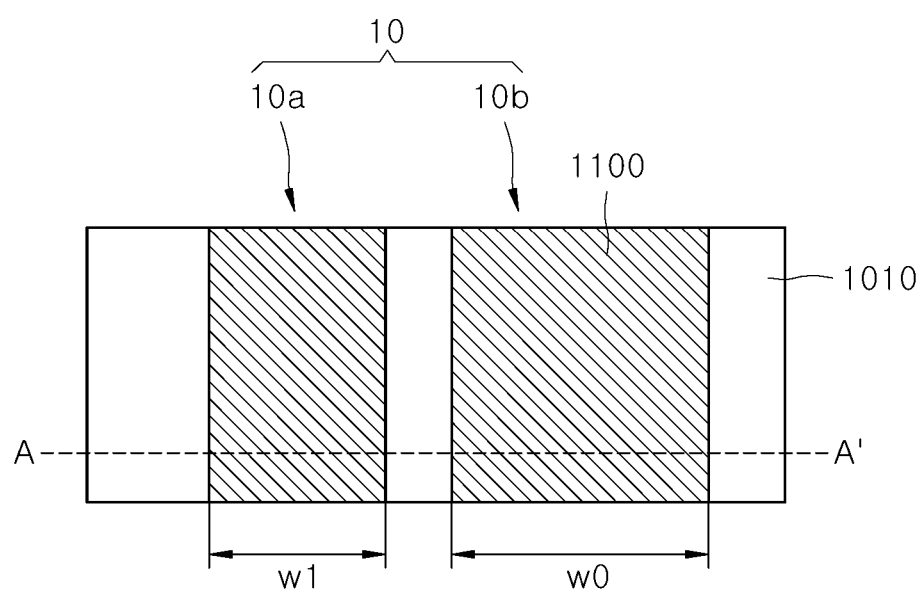
Figure 6B:
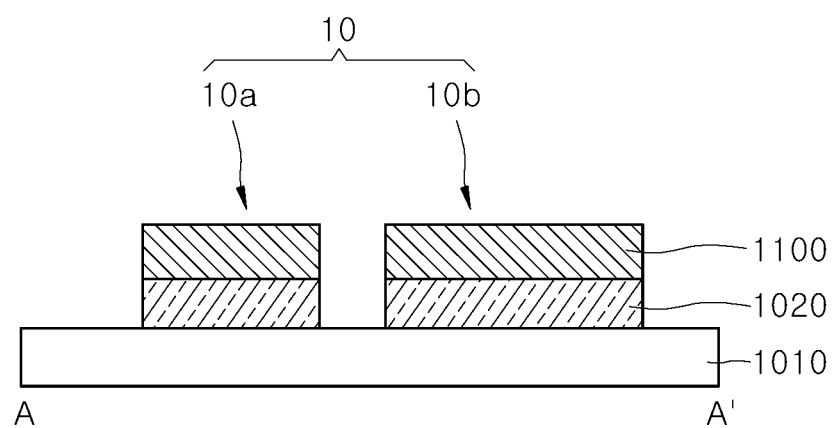

Referring to FIGS. 6A and 6B, the base insulating layer 1020 and the first conductive layer 1100 may be patterned over the substrate 1010 to form a first pattern structure 10. The first pattern structure 10 may include first and second line pattern structures 10a and 10b extending in the y-direction. The first and second line pattern structures 10a and 10b may have different widths w1 and w0, respectively, in the x-direction.

Figure 7A:
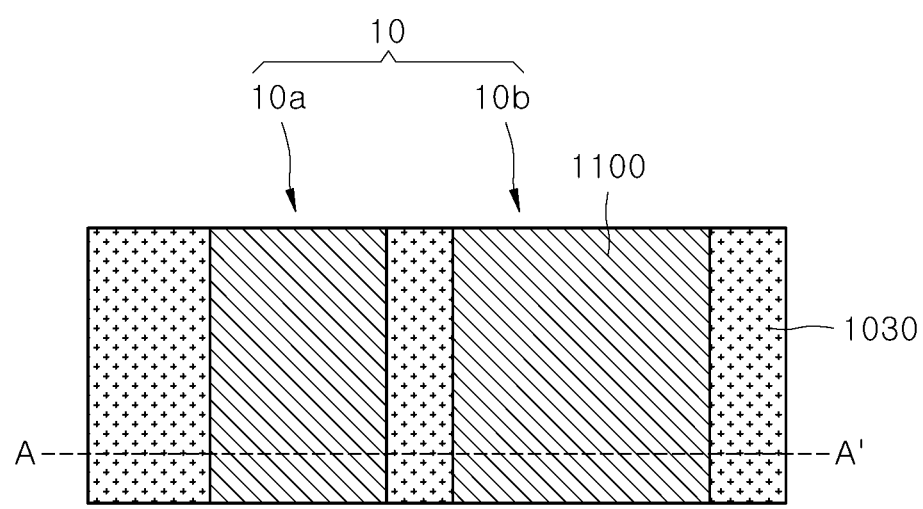
Figure 7B:
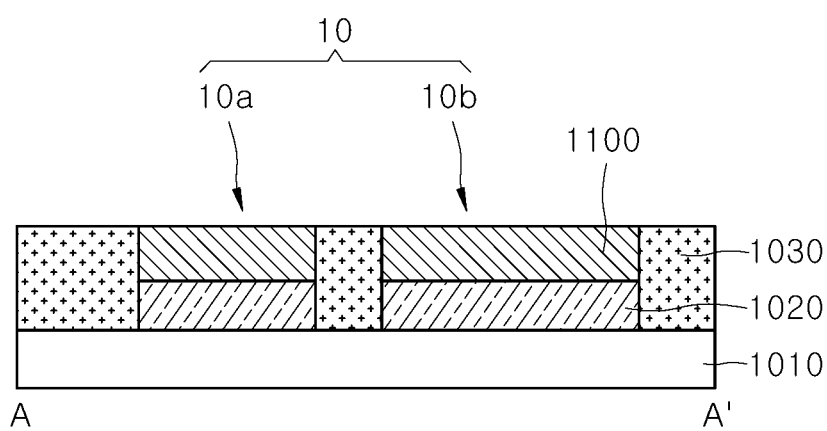

Referring to FIGS. 7A and 7B, spaces exposed by the first pattern structure 10 over the substrate 1010 may be filled with a first insulating layer 1030. The first insulating layer 1030 may include, for example, oxide, nitride, oxynitride, or two or more thereof. The first insulating layer 1030 may be formed, for example, using a chemical vapor deposition method, an atomic layer deposition method, a coating method, or the like. The first insulating layer 1030 may fill the spaces exposed by the first pattern structure 10, and may also be formed over the first conductive layer 1100.

Subsequently, a planarization process for the first insulating layer 1030 may be performed so that an upper surface of the first insulating layer 1030 is at the same level as an upper surface of the first pattern structure 10. The planarization process may be performed by, for example, a chemical mechanical polishing (CMP) method.

Figure 8A:
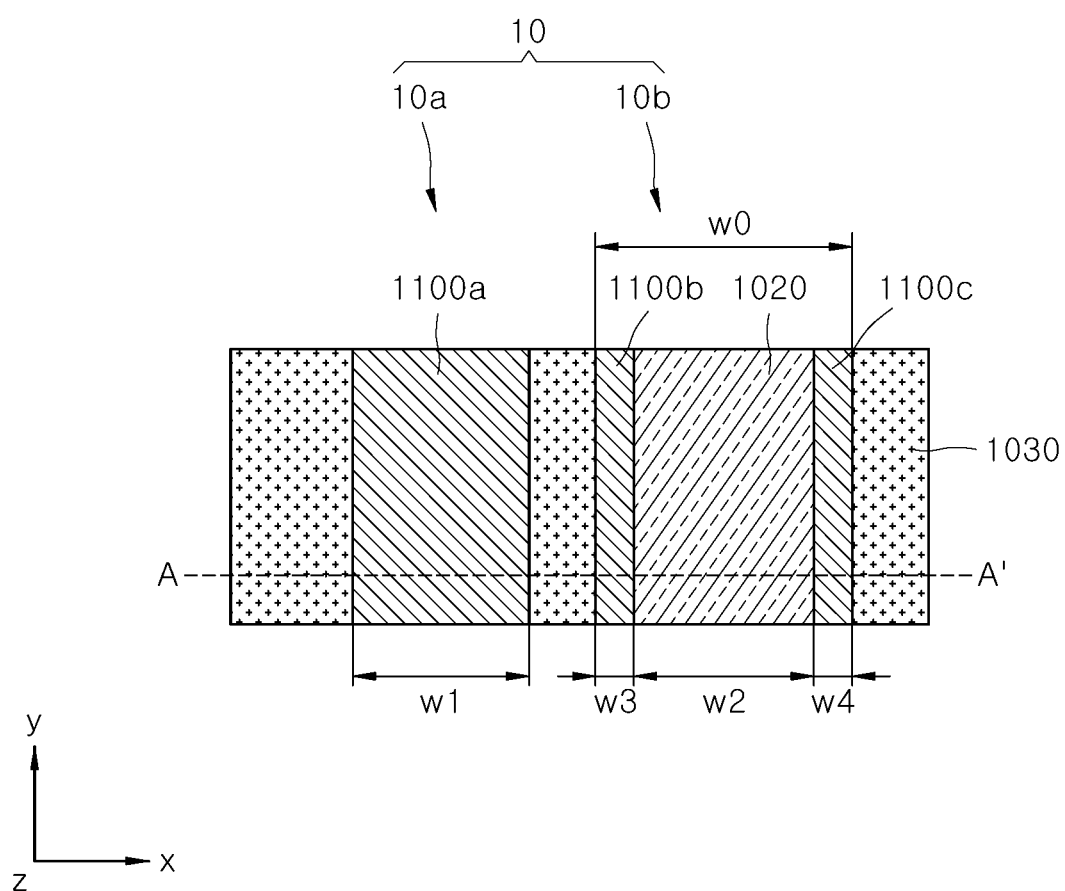
Figure 8B:
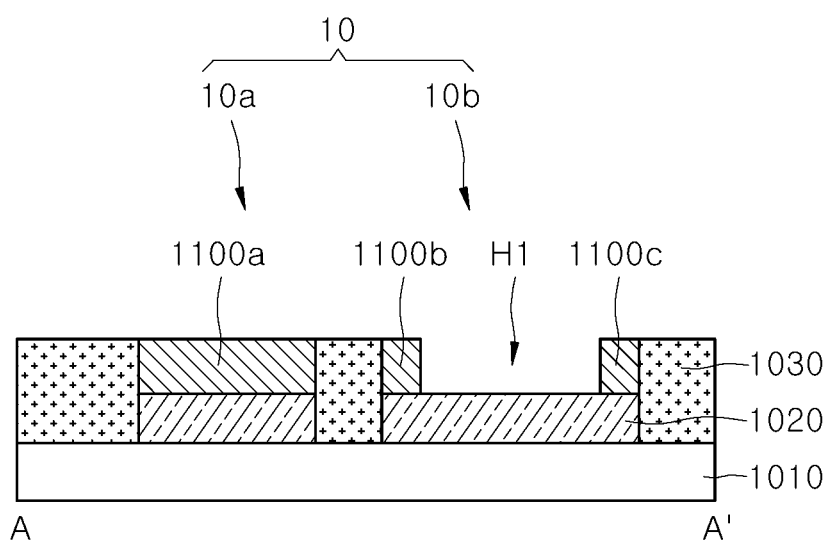

Referring to FIGS. 8A and 8B, the first conductive layer 1100 of the second line pattern structure 10b may be patterned over the base insulating layer 1020. The first conductive layer 1100 may be selectively etched along the y-direction over the base insulating layer 1020 to form a trench pattern H1 having a predetermined width w2.

Referring to FIG. 8A, the first conductive layer 1100 of the first line pattern structure 10a might not be patterned. In this case, the first conductive layer 1100 of the first line pattern structure 10a may become a write word line 1100a having a predetermined width w1. After patterning the first conductive layer 1100 of the second line pattern structure 10b, un-patterned portions of the first conductive layer 1100 of the second line pattern structure 10b may be converted into a read word line 1100b and a read bit line 1100c having predetermined widths w3 and w4, respectively.

Figure 9A:
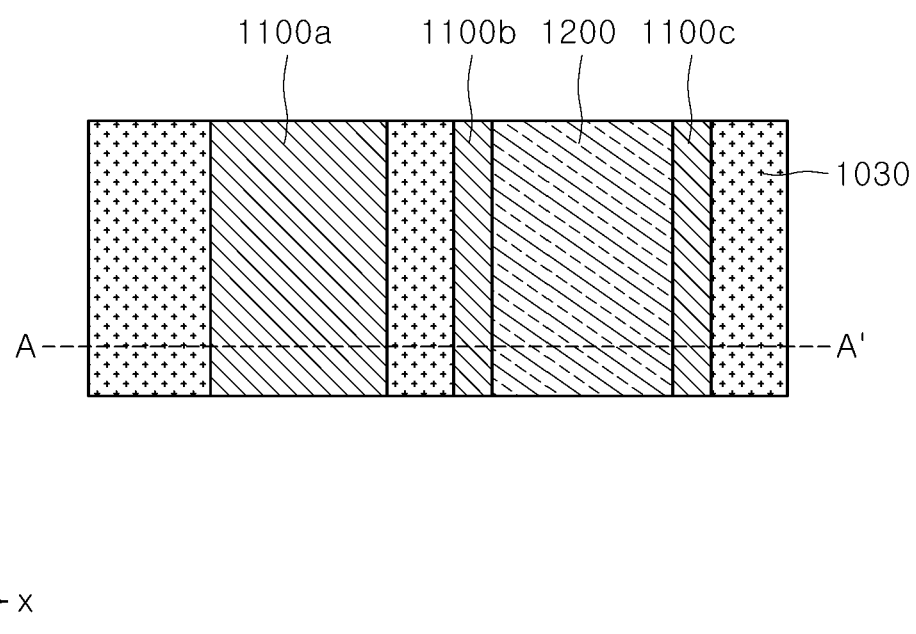
Figure 9B:
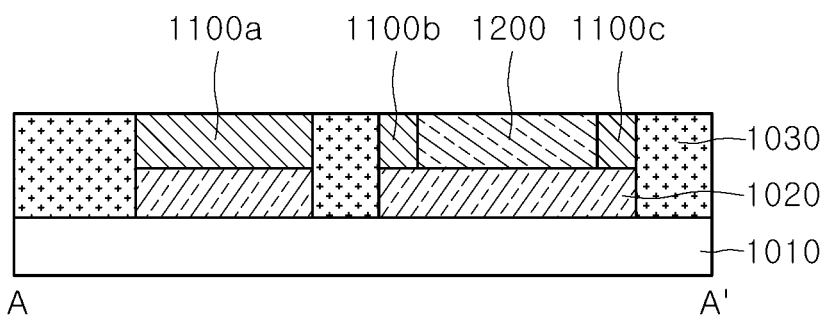

Referring to FIGS. 9A and 9B, a first semiconductor material layer 1200 may be formed in the first trench pattern H1. The first semiconductor material layer 1200 may include, for example, semiconductor, conductive metal oxide, transition metal chalcogenide, or a combination of two or more thereof. As an example, the semiconductor may include doped silicon (Si). As another example, the conductive metal oxide may include indium oxide ($In_2O_3$), dopant-doped indium oxide ($In_2O_3$), indium gallium zinc oxide ($InGaZnO_4$), zinc oxide (ZnO), indium gallium oxide ($InGaO_3$), or the like. The dopant may include titanium (Ti), tungsten (W), silicon (Si), or a combination of two or more thereof. A process of forming the first semiconductor material layer 1200 may be, for example, a chemical vapor deposition method, an atomic layer deposition method, or the like. The first semiconductor material layer 1200 may fill the first trench pattern H1, and may also be formed over the first insulating layer 1030, the write word line 1100a, the read word line 1100b, and the read bit line 1100c positioned outside the first trench pattern H1.

Subsequently, a planarization process for the first semiconductor material layer 1200 may be performed so that an upper surface of the first semiconductor material layer 1200 is at the same level as upper surfaces of the first insulating layer 1030, the write word line 1100a, the read word line 1100b, and the read bit line 1100c. The planarization process may be performed, for example, by a chemical mechanical polishing (CMP) method.

Figure 10A:
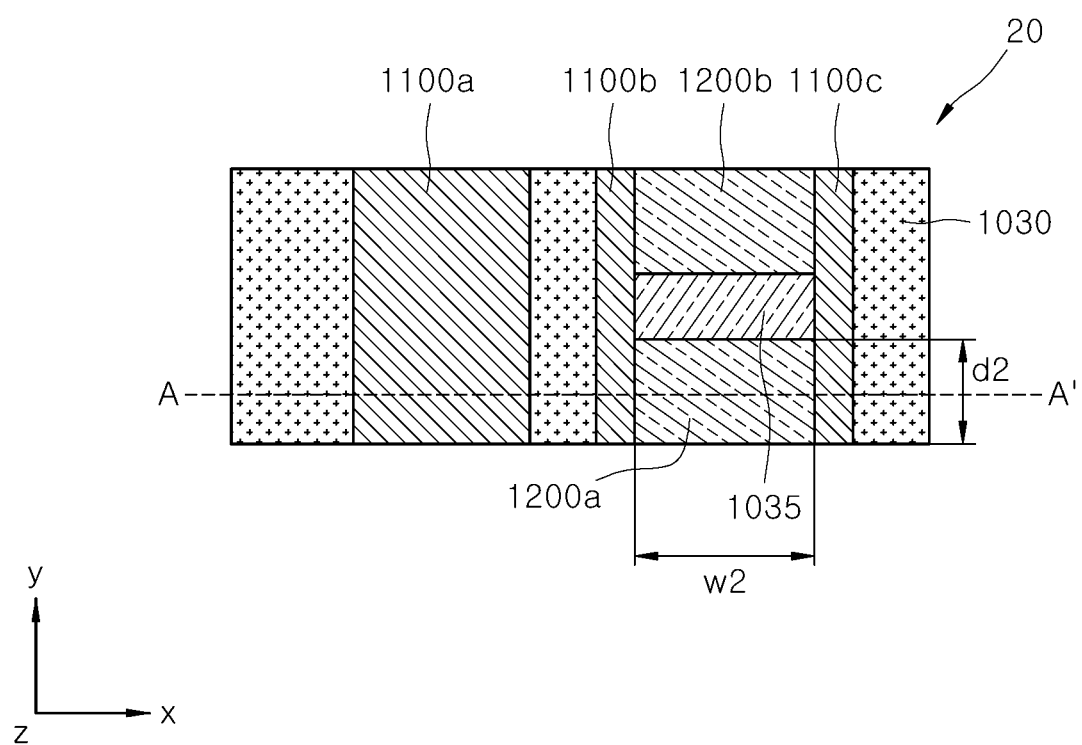
Figure 10B:
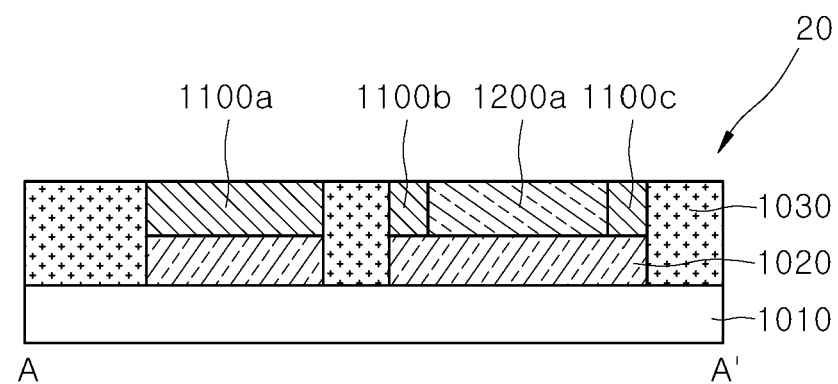

Referring to FIGS. 10A and 10B, the first semiconductor material layer 1200 may be selectively etched over the base insulating layer 1020 to form a trench. The trench may be filled with an insulating material to form a device isolation insulating layer 1035. Accordingly, read channel layers 1200a and 1200b, which are different from each other, may be formed from the semiconductor material layer 1200. Each of the read channel layers 1200a and 1200b may have a predetermined width w2 in the x-direction and a predetermined length d2 in the y-direction. Accordingly, a second pattern structure 20 may be formed. The second pattern structure 20 may include the write word line 1100a, the read channel layers 1200a and 1200b disposed to be spaced apart from the write word line 1100a in the x-direction, and a read word line 1100b and a read bit line 1100c disposed at opposite ends, in the x-direction, of the read channel layers 1200a and 1200b.

Figure 11A:
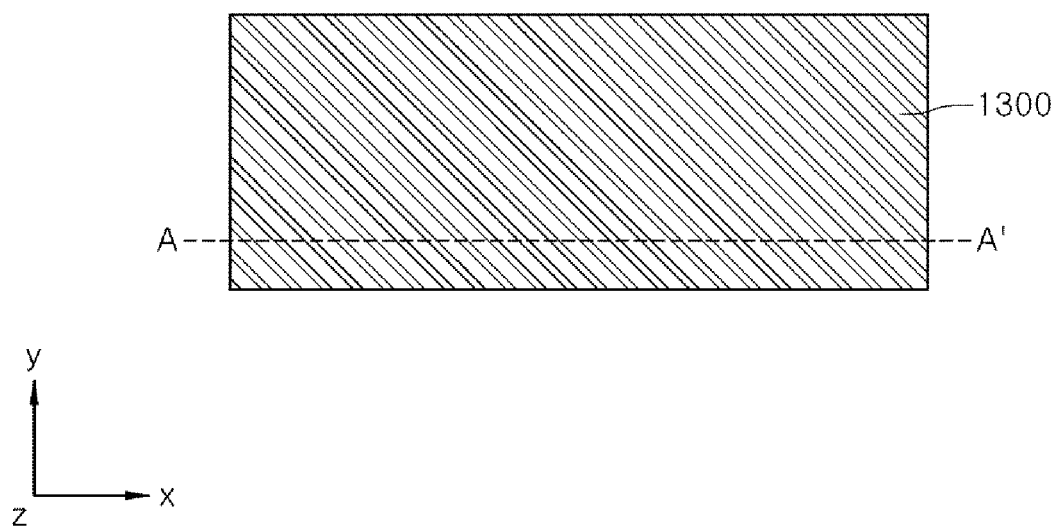
Figure 11B:
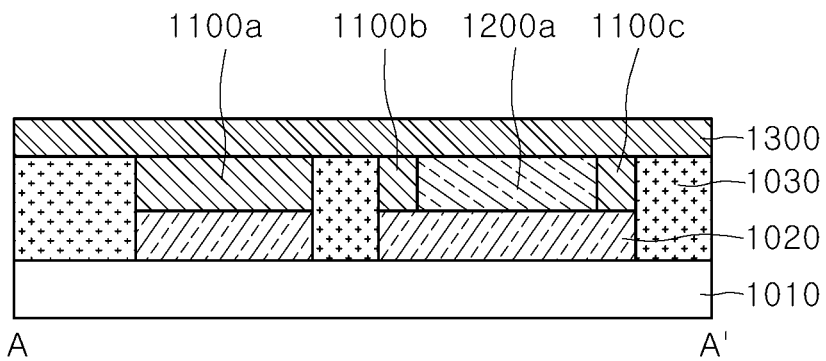

Referring to FIGS. 11A and 11B, a dielectric layer 1300 may be formed over the second pattern structure 20. The dielectric layer 1300 may include, for example, silicon oxide, silicon nitride, silicon oxynitride, aluminum oxide, hafnium oxide, zirconium oxide, or a combination of two or more thereof. The dielectric layer 1300 may be formed, for example, using a chemical vapor deposition method, an atomic layer deposition method, or the like.

Figure 12A:
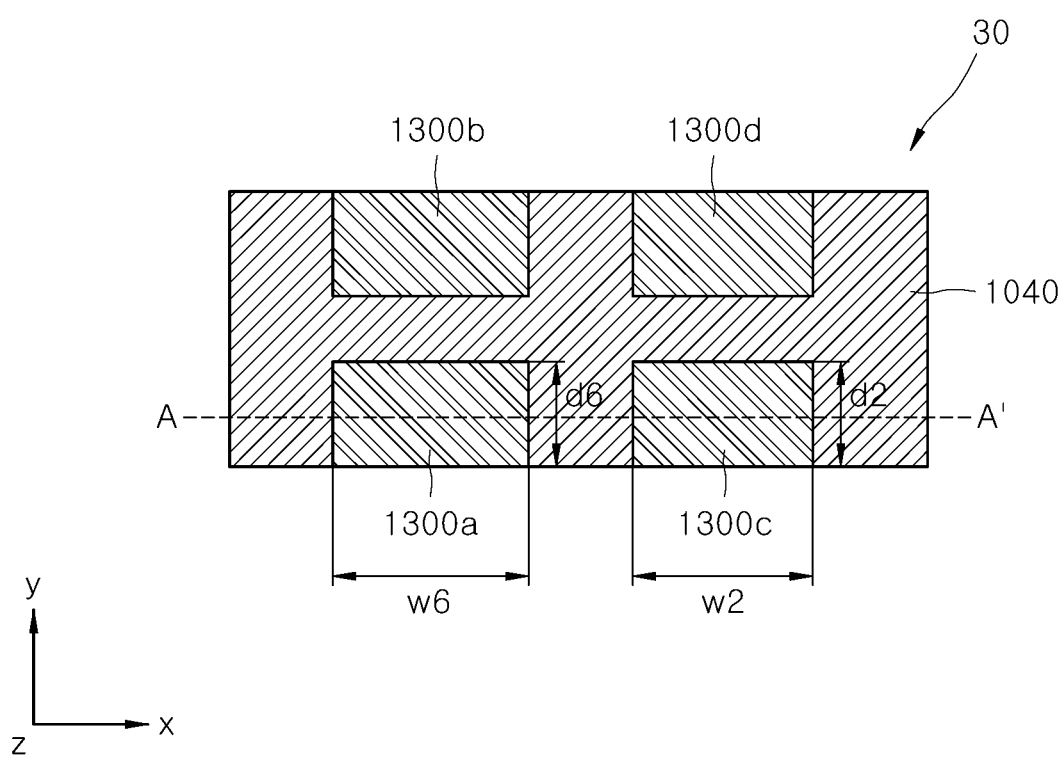
Figure 12B:
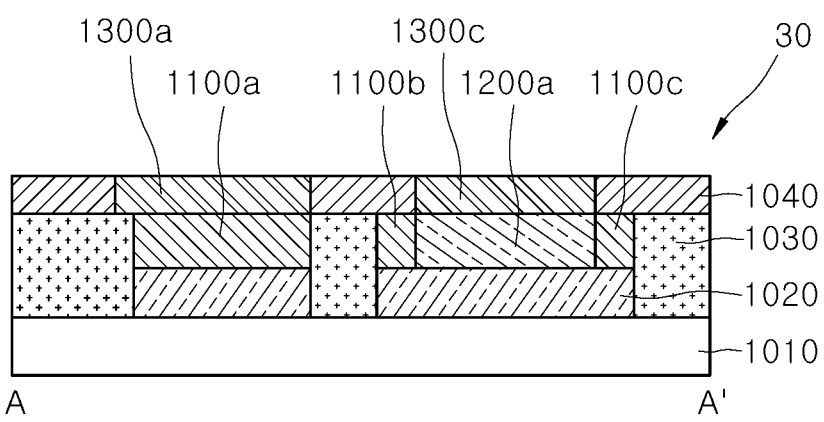

Referring to FIGS. 12A and 12B, the dielectric layer (1300 of FIGS. 11A and 11B) may be patterned over the second pattern structure 20 of FIGS. 10A and 10B to form a write gate dielectric layers 1300a and 1300b, and read gate dielectric layers 1300c and 1300d. A second insulating layer 1040 may be formed in spaces between the write gate dielectric layers 1300a and 1300b and the read gate dielectric layers 1300c and 1300d. The second insulating layer 1040 may include, for example, oxide, nitride, oxynitride, or a combination of two or more thereof. The second insulating layer 1040 may be formed, for example, using a chemical vapor deposition method, an atomic layer deposition method, or the like. The second insulating layer 1040 may be formed over the write gate dielectric layers 1300a and 1300b and the read gate dielectric layers 1300c and 1300d as well as in the spaces between the write gate dielectric layers 1300a and 1300b and the read gate dielectric layers 1300c and 1300d.

Next, the second insulating layer 1040 may be planarized so that an upper surface of the second insulating layer 1040 is positioned at the same level as upper surfaces of the write gate dielectric layers 1300a and 1300b and the read gate dielectric layers 1300c and 1300d. Accordingly, a third pattern structure 30 may be formed.

Each of the write gate dielectric layers 1300a and 1300b may be formed to have a predetermined width w6 in the x-direction and a predetermined length d6 in the y-direction. The width w6 of each of the write gate dielectric layers 1300a and 1300b may be wider than the width w1 of the write word line 1100a of FIG. 8A. The read gate dielectric layer 1300c and 1300d may be formed to be overlapped with the read channel layers 1200a and 1200b of FIG. 10A, respectively, in the z-direction. Each of the read gate dielectric layers 1300c and 1300d may be formed to have a predetermined width w2 in the x-direction and a predetermined length d2 in the y-direction.

Figure 13A:
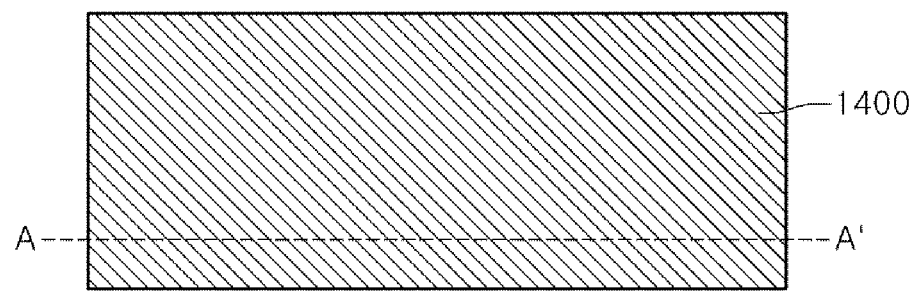
Figure 13B:
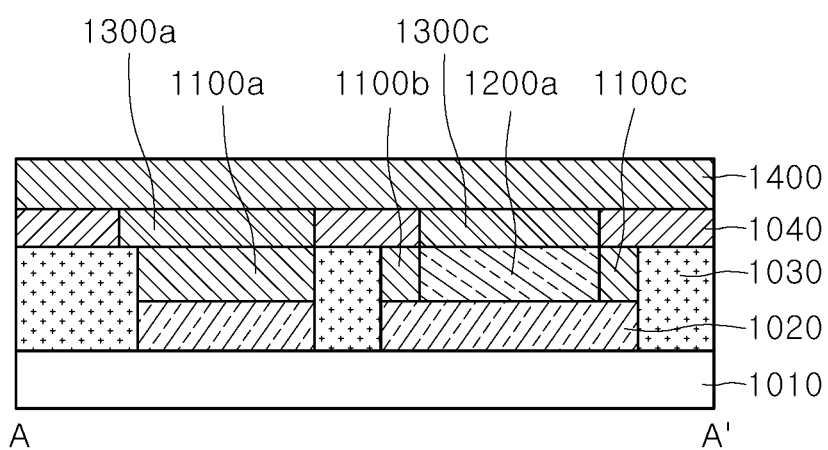

Referring to FIGS. 13A and 13B, a second conductive layer 1400 may be formed over the third pattern structure (30 of FIGS. 12A and 12B). The second conductive layer 1400 may include a conductive material. The second conductive layer 1400 may be formed of substantially the same material as the first conductive layer 1100 of FIGS. 5A and 5B. The second conductive layer 1400 may be formed, for example, using a chemical vapor deposition method, an atomic layer deposition method, or a sputtering method.

Figure 14A:
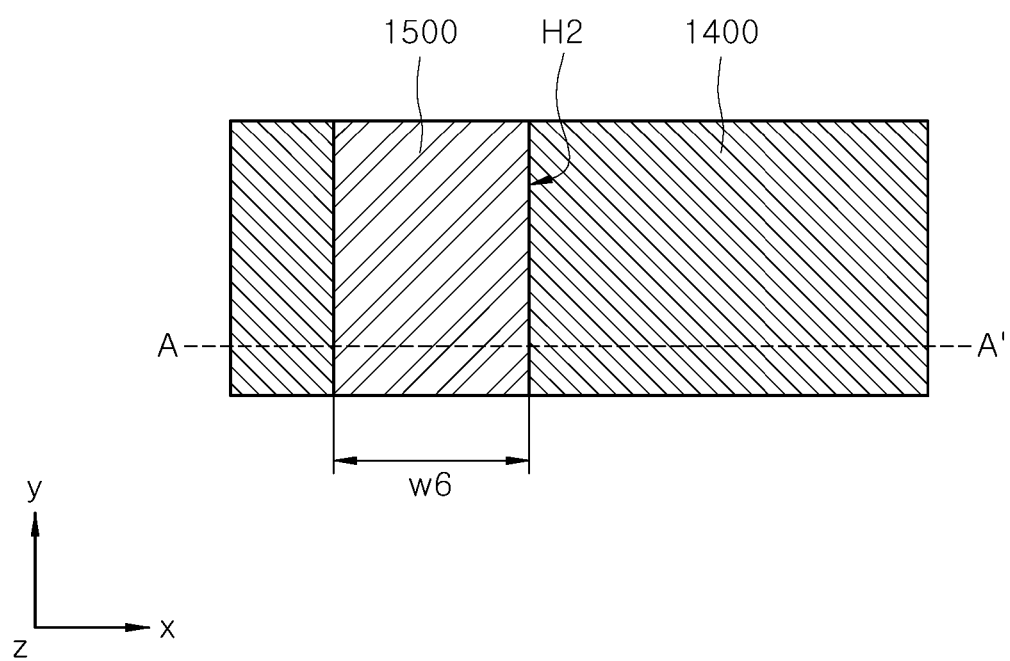
Figure 14B:
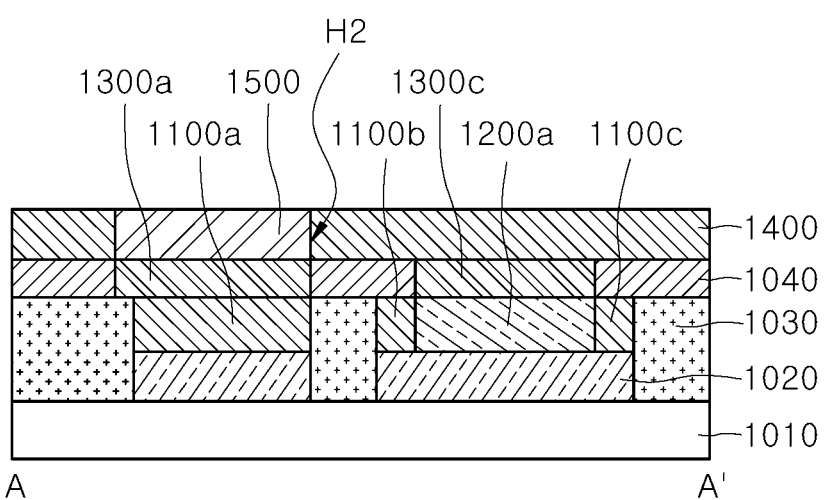

Referring to FIGS. 14A and 14B, the second conductive layer 1400 may be patterned over the third pattern structure 30 to form a trench pattern H2 extending in the y-direction. The trench pattern H2 may have a predetermined width w6 in the x-direction. The width w6 of the trench pattern H2 may be substantially the same as the width w6 of each of the write gate dielectric layers 1300a and 1300b.

Next, a second semiconductor material layer 1500 may be formed in the trench pattern H2. The second semiconductor material layer 1500 may be formed of substantially the same material as the first semiconductor material layer 1200 of FIGS. 9A and 9B. As a process of forming the second semiconductor material layer 1500, for example, a chemical vapor deposition method, an atomic layer deposition method, or the like may be applied. The second semiconductor material layer 1500 may fill the trench pattern H2, and may also be formed over the second conductive layer 1400 positioned outside the trench pattern H2.

Subsequently, a planarization process may be performed for the second semiconductor material layer 1500 so that an upper surface of the second semiconductor material layer 1500 is at the same level as an upper surface of the second conductive layer 1400. The planarization process may be performed, for example, by a chemical mechanical polishing (CMP) method.

Figure 15A:
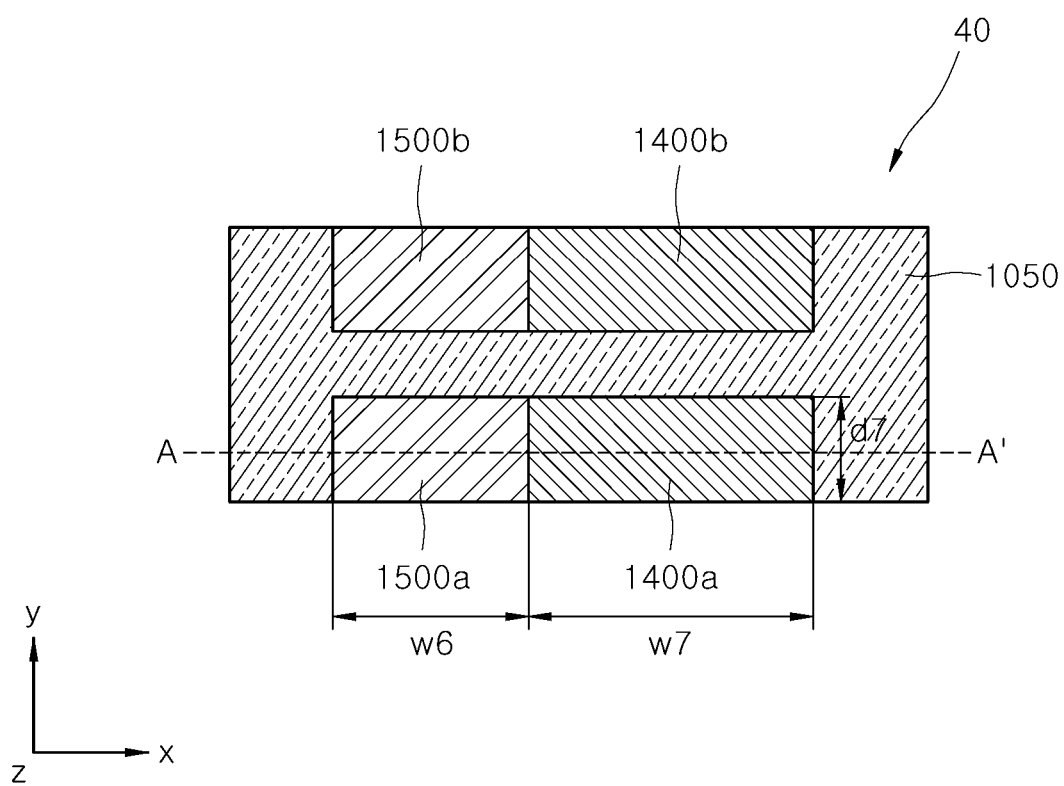
Figure 15B:
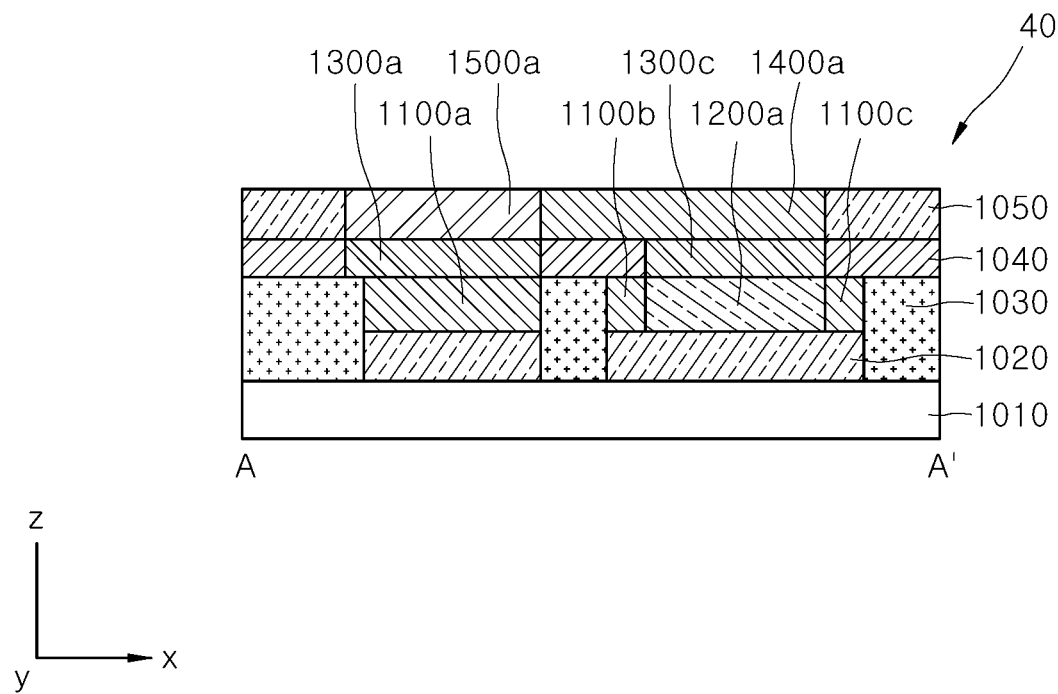

Referring to FIGS. 15A and 15B, a patterning process for the second conductive layer 1400 and the second semiconductor layer 1500 may be performed over the third pattern structure 30. As a result of the patterning process, the second conductive layer 1400 and the second semiconductor layer 1500 may be separated from each other in the y-direction to form write channel layers 1500a and 1500b and read gate electrode layers 1400a and 1400b. Each of the write channel layers 1500a and 1500b may have a predetermined width w6 in the x-direction and a predetermined length d7 in the y-direction. Each of the read gate electrode layers 1400a and 1400b may have a predetermined width w7 in the x-direction and a predetermined length d7 in the y-direction.

Next, a third insulating layer 1050 may be formed between the write channel layers 1500a and 1500b and the read gate electrode layers 1400a and 1400b over the third pattern structure (30 of FIGS. 12A and 12B). At this time, the third insulating layer 1050 may be planarized so that an upper surface of the third insulating layer 1050 may be positioned at the same level as upper surfaces of the write channel layers 1500a and 1500b and the read gate electrode layers 1400a and 1400b. The third insulating layer 1050 may include, for example, oxide, nitride, oxynitride, or a combination of two of more thereof. The third insulating layer 1050 may be formed, for example, using a chemical vapor deposition, an atomic layer deposition method, or the like. Through the above-described process, a fourth pattern structure 40 may be formed.

Figure 16A:
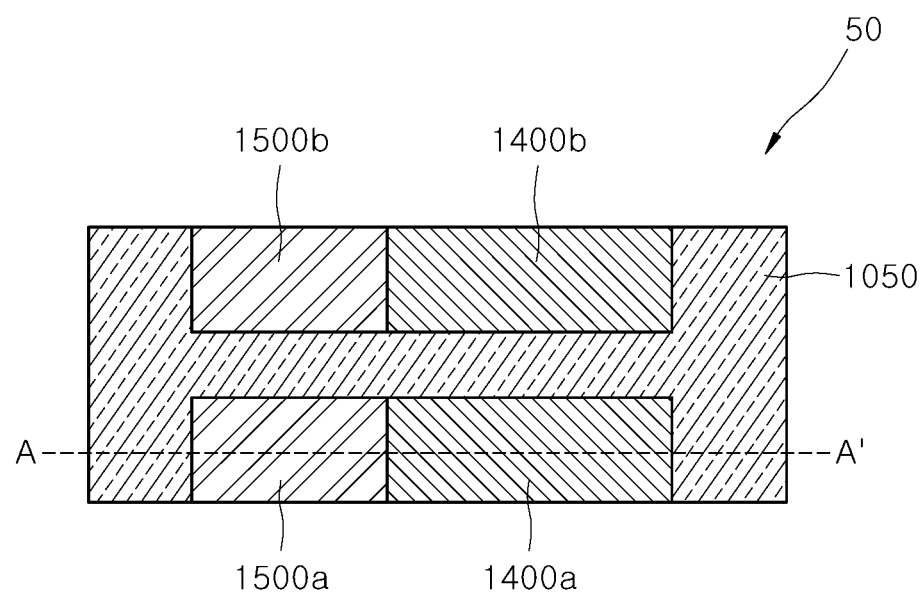
Figure 16B:
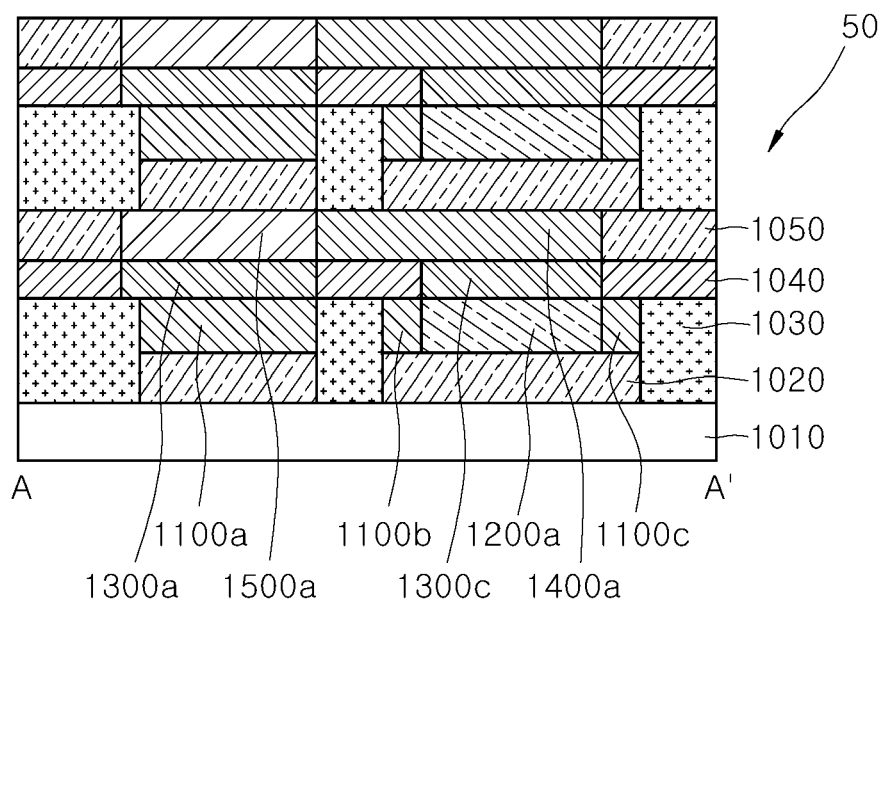

Referring to FIGS. 16A and 16B, a fifth pattern structure 50 may be formed over the fourth pattern structure (40 of FIG. 14A of 14B) by repeating the processes of manufacturing the pattern structures related to FIGS. 5A to 15A and FIGS. 5B to 15B. The fifth pattern structure 50 may have a structure in which the fourth pattern structure 40, except for the substrate 1010, is overlapped and stacked over the fourth pattern structure 40.

Figure 17A:
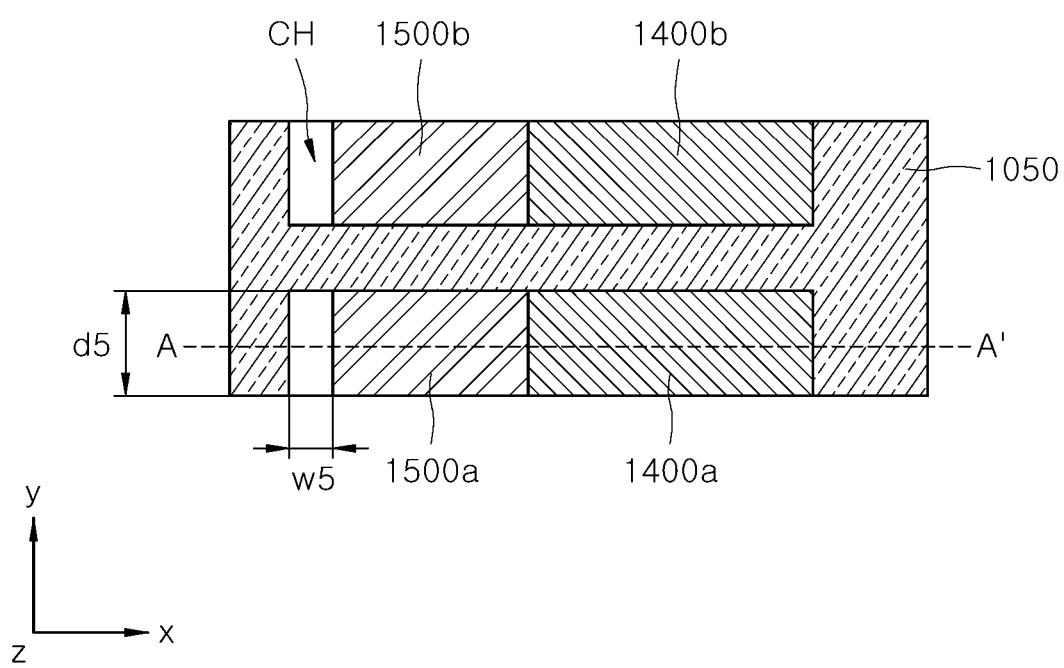
Figure 17B:
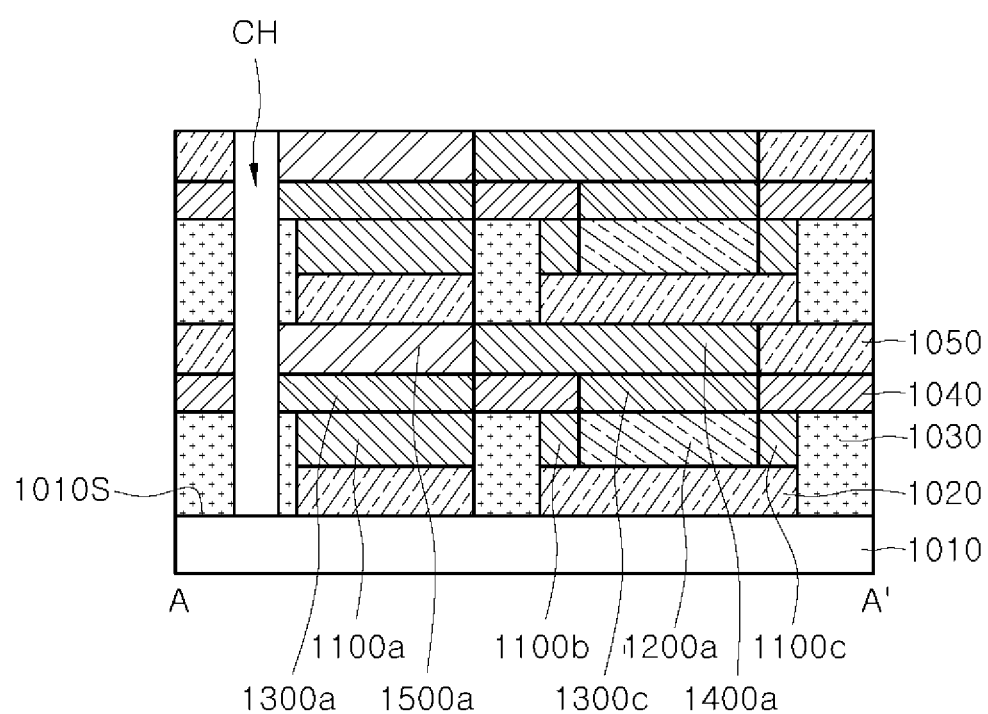

Referring to FIGS. 17A and 17B, a contact hole CH may be formed to penetrate the fifth pattern structure 50 over the substrate 1010. The contact hole CH may be formed to extend in the z-direction substantially perpendicular to the surface 1010S of the substrate 1010. The contact hole CH may expose a side surface of each of the write channel layers 1500a and 1500b. As shown in FIG. 17A, the contact hole CH may have a rectangular shape having a predetermined width w5 in the x-direction and a predetermined length d5 in the y-direction when viewed in a cross-section substantially parallel to the surface 1010S of the substrate 1010.

Figure 18A:
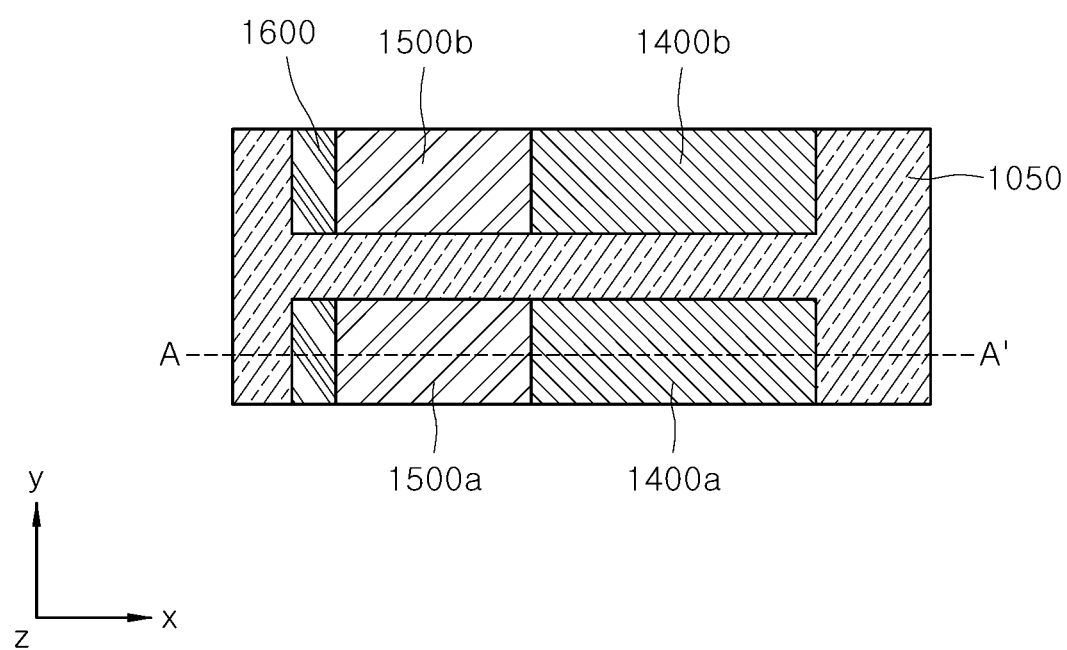
Figure 18B:
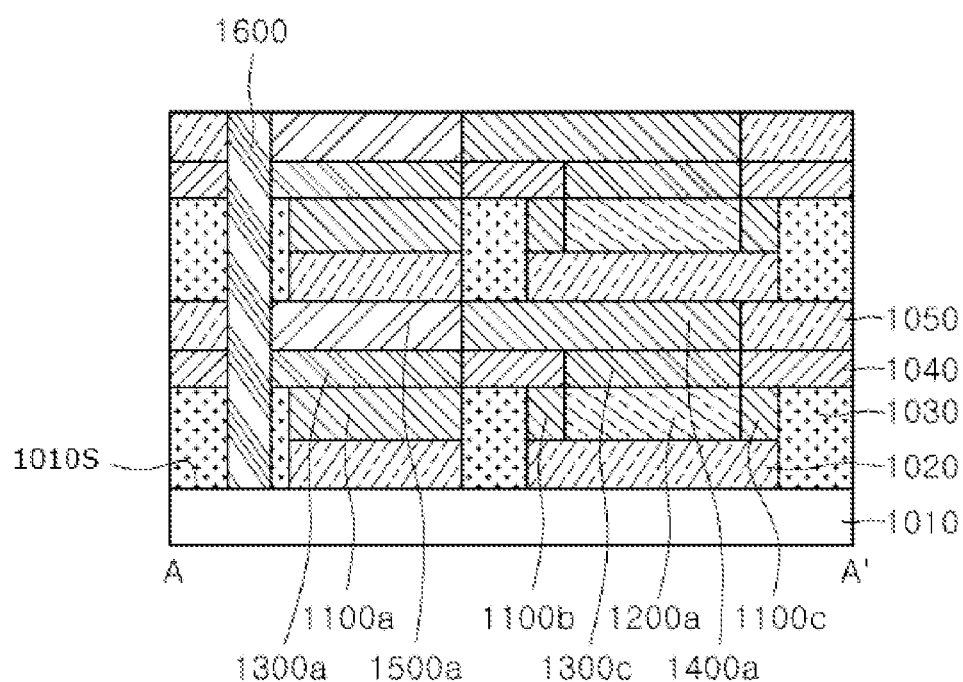

Referring to FIGS. 18A and 18B, the contact hole CH may be filled with a third conductive layer 1600 to form a write bit line 1600. The third conductive layer 1600 may be formed of substantially the same material as the second conductive layer 1400 of FIGS. 13A and 13B. The third conductive layer 1600 may be formed, for example, using a chemical vapor deposition method, an atomic layer deposition method, or the like. The write bit line 1600 may include a pillar structure extending in the z-direction. The write bit line 1600 may contact the side surface of each of the write channel layers 1500a and 1500b.

The semiconductor device according to an embodiment of the present disclosure may be fabricated by the above-described method.

Figure 19:
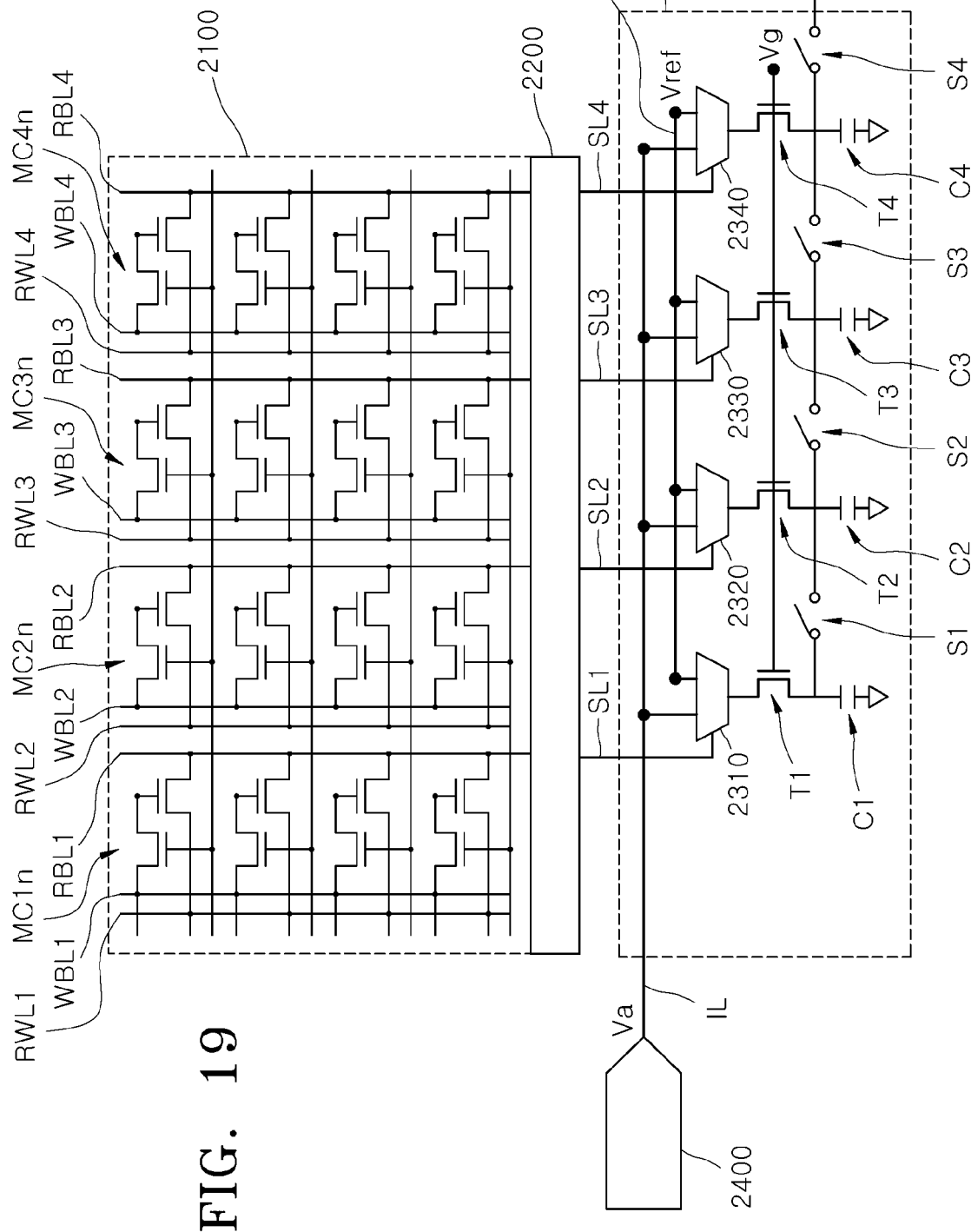
FIG. 19 is a view schematically illustrating a semiconductor device including memory cells according to an embodiment of the present disclosure.

FIG. 19 is a view schematically illustrating a semiconductor device including memory cells according to an embodiment of the present disclosure. Referring to FIG. 19, a semiconductor device 4 may be an analog computing in-memory (CIM) device that performs multiplication and accumulation (hereinafter, referred to as "MAC") operations.

The semiconductor device 4 may include a cell array 2100 including a plurality of memory cells for storing a plurality of weights, a read and write circuit 2200 electrically connected to the cell array 2100, a MAC operation circuit 2300 for performing MAC operations, a digital-to-analog converter 2400 and an analog-to-digital converter 2500 that are connected to the MAC operation circuit 2300 through an input line and an output line, respectively.

The cell array 2100 may include first to fourth groups of memory cells MC1n, MC2n, MC3n, and MC4n. Each of the memory cells constituting the first to fourth groups of memory cells MC1n, MC2n, MC3n, and MC4n may be substantially the same as the memory cell MC described above with reference to FIG. 1. That is, each of the memory cells constituting the first to fourth groups of memory cells MC1n, MC2n, MC3n, and MC4n may include a write transistor and a read transistor according to an embodiment of the present disclosure.

In addition, the electrical connection between the memory cells constituting the first to fourth groups of memory cells MC1n, MC2n, MC3n, and MC4n may be substantially the same as the electrical connection between the memory cells MC1, MC2, MC3, and MC4 described above with reference to FIG. 2.

Each of the memory cells constituting the first to fourth groups of memory cells MC1n, MC2n, MC3n, and MC4n may store weights for performing the MAC operation. Each of the memory cells constituting the first group of memory cells MC1n may store a first weight for performing the MAC operation. Likewise, each of the memory cells constituting the second group of memory cells MC2n may store a second weight for performing the MAC operation, each of the memory cells constituting the third group of memory cells MC3n may store a third weight for performing the MAC operation, and each of the memory cells constituting the fourth group of memory cells MC4n may store a fourth weight for performing the MAC operation. That is, the number of weights may be proportional to the number of groups of memory cells.

Referring to FIG. 19, a plurality of memory cells constituting the first group of memory cells MC1n may share a first write bit line WBL1, a first read word line RWL1, and a first read bit line RBL1 with each other. A plurality of memory cells constituting the second group of memory cells MC2n may share a second write bit line WBL2, a second read word line RWL2, and a second read bit line RBL2 with each other. A plurality of memory cells constituting the third group of memory cells MC3n may share a third write bit line WBL3, a third read word line RWL3, and a third read bit line RBL3 with each other. A plurality of memory cells constituting the fourth group of memory cells MC4n may share a fourth write bit line WBL4, a fourth read word line RWL4, and a fourth read bit line RBL4 with each other.

The first to fourth weights stored in the memory cells constituting the first to fourth group of memory cells MC1n, MC2n, MC3n, and MC4n may be output to the read and write circuit 2200 through the first to fourth read bit lines RBL1, RBL2, RBL3, and RBL4, respectively, under the control of the read and write circuit 2200.

The read and write circuit 2200 may provide the first to fourth weights output from the memory cells to first to fourth multiplexers 2310, 2320, 2330, and 2340 of the MAC operation circuit 2300, respectively. The first to fourth weights may be input to the first to fourth multiplexers 2310, 2320, 2330, and 2340 as selection signals through corresponding first to fourth selection signal lines SL1, SL2, SL3, and SL4, respectively.

Referring to FIG. 19, the digital-to-analog converter 2400 may convert a digital input signal for performing a MAC operation into an analog signal using a known capacitor charge sharing method, and then provide the analog signal to the MAC operation circuit 2300. In an embodiment, the digital input signal may be a 4-bit signal. As an example, the digital input signal may be 0000, 0001, 0010, . . . , or 1111. The number of bits constituting the digital input signal may be the same as the number of capacitors C1, C2, C3, and C4 of the MAC operation circuit 2300. The analog signal may be a signal having a predetermined voltage level. The analog signal may be input as a first input signal Va of the first to fourth multiplexers 2310, 2320, 2330, and 2340 through a first input line IL.

Referring to FIG. 19, the MAC operation circuit 2300 may include the first to fourth multiplexers 2310, 2320, 2330, and 2340, first to fourth control transistors T1, T2, T3, and T4, and the first to fourth capacitors C1, C2, C3, and C4.

The first to fourth multiplexers 2310, 2320, 2330, and 2340 may receive the first input signal Va through the first input line IL, and may receive a second input signal Vref having a reference voltage level through a second input line RL. The first to fourth multiplexers 2310, 2320, 2330, and 2340 may output one of the first input signal Va and the second input signal Vref, depending on the first to fourth weights input through the first to fourth selection signal lines SL1, SL2, SL3, and SL4, respectively. The signals output from the first to fourth multiplexers 2310, 2320, 2330, and 2340 may be charged in the first to fourth capacitors C1, C2, C3, and C4 when the control transistors T1, T2, T3, and T4 are respectively turned-on by application of an operation voltage Vg. Because the first to fourth capacitors C1, C2, C3, and C4 have different capacitances from each other, different amounts of charges may be stored in the first to fourth capacitors C1, C2, C3, and C4.

Thereafter, when the control transistors T1, T2, T3, and T4 are turned-off and the first to fourth switches S1, S2, S3, and S4 are switched-on, the amounts of charges stored in the first to fourth capacitors C1, C2, C3, and C4 may be summed to generate a predetermined analog voltage signal. The analog voltage signal may be output from the MAC operation circuit 2300 as an output signal.

In the present specification, the above-described analog operation through the first to fourth multiplexers 2310, 2320, 2330, 2340, the first to fourth control transistors T1, T2, T3, and T4, and the first to fourth capacitors C1, C2, C3, and C4 may be referred to as a MAC operation.

Meanwhile, the analog voltage signal may be provided to the analog-to-digital converter 2500 through the output line OL. The analog-to-digital converter 2500 may convert the analog voltage signal into a digital signal.

As described above, because the first to fourth capacitors C1, C2, C3, and C4 have different capacitances from each other, the analog-to-digital converter 2500 may derive 4-bit digital signals that are distinguished from each other from the analog voltage signal.

According to an embodiment of the present disclosure, a memory cell having a write transistor and a read transistor may be applied to memory cells that store a plurality of weights in a computing in-memory (CIM) device. In the memory cells according to an embodiment of the present disclosure, the write transistors and the read transistors are densely arranged over a substrate, so that the density of the memory cells may be increased. Accordingly, the degree of integration of cell arrays inside the computing in-memory device may be effectively improved.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor device comprising:
a write transistor and a read transistor disposed over a substrate,
the write transistor comprises
a write word line disposed on a plane that is substantially parallel to a surface of the substrate;
a write gate dielectric layer disposed over the write word line;
a write channel layer disposed over the write gate dielectric layer; and
a write bit line disposed over the substrate and extending in a direction substantially perpendicular to the surface of the substrate, and electrically connected to one end of the write channel layer, and
the read transistor comprises
a read channel layer disposed on the plane over the substrate;
a read gate dielectric layer disposed over the read channel layer; and
a read gate electrode layer disposed over the read gate dielectric layer and electrically connected to the other end of the write channel layer,
wherein the write word line of the write transistor and the read channel layer of the read transistor are disposed on the same plane.

2. The semiconductor device of claim 1, wherein the write word line extends in a direction substantially parallel to the surface of the substrate.

3. The semiconductor device of claim 1, wherein the read transistor further comprises a read word line and a read bit line that are disposed on the plane and that are electrically connected to opposite ends of the read channel layer.

4. The semiconductor device of claim 3, wherein the read word line and the read bit line are disposed to be substantially parallel to the write word line.

5. The semiconductor device of claim 1, wherein the write bit line comprises a conductive pillar structure.

6. The semiconductor device of claim 1, wherein the write word line and the read channel layer have the same thickness.

7. The semiconductor device of claim 6, wherein the write gate dielectric layer and the read gate dielectric layer have the same thickness.

8. The semiconductor device of claim 1, wherein the write channel layer and the read gate electrode layer are disposed on the same plane.

9. The semiconductor device of claim 8, wherein the write channel layer and the read gate electrode layer have the same height.

10. The semiconductor device of claim 1, wherein each of the write channel layer and the read channel layer comprises at least one selected from semiconductor, conductive oxide, and transition metal chalcogenide.

11. The semiconductor device of claim 1, wherein the write gate dielectric layer and the write channel layer have the same cross-sectional area on a cross-sectional plane substantially parallel to the surface of the substrate.

12. The semiconductor device of claim 1, wherein the read gate dielectric layer and the read channel layer have the same cross-sectional area on a cross-sectional plane substantially parallel to the surface of the substrate.

13. A semiconductor device comprising a write transistor and a read transistor disposed over a substrate,
wherein the write transistor comprises:
a write bit line over the substrate that extends in a first direction substantially perpendicular to a surface of the substrate;
a write channel layer having one end in contact with the write bit line;
a write gate dielectric layer disposed on a surface of the write channel layer; and
a write word line disposed on a surface of the write gate dielectric layer and extending in a second direction substantially parallel to the surface of the substrate, and
wherein the read transistor comprises:
a read gate electrode layer disposed to contact the other end of the write channel layer;
a read gate dielectric layer disposed on a surface of the read gate electrode layer; and
a read channel layer disposed on a surface of the read gate dielectric layer,
wherein the write word line of the write transistor and the read channel layer of the read transistor are disposed on the same plane.

14. The semiconductor device of claim 13, wherein the read transistor further comprises a read word line and a read bit line respectively disposed to contact opposite ends of the read channel layer.

15. The semiconductor device of claim 13, wherein the write bit line comprises a conductive pillar structure extending in the first direction.

* * * * *